(12) United States Patent
Aono

(10) Patent No.: US 11,275,114 B2
(45) Date of Patent: Mar. 15, 2022

(54) SEMICONDUCTOR DEVICE FOR CONTROLLING SUPPLY OF CLOCK SIGNAL

(71) Applicants: Kabushiki Kaisha Toshiba, Tokyo (JP); Toshiba Electronic Devices & Storage Corporation, Tokyo (JP)

(72) Inventor: Takashi Aono, Kamakura Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 17/017,772

(22) Filed: Sep. 11, 2020

(65) Prior Publication Data

US 2021/0293882 A1 Sep. 23, 2021

(30) Foreign Application Priority Data

Mar. 19, 2020 (JP) .............................. JP2020-049250

(51) Int. Cl.
G01R 31/317 (2006.01)
G01R 31/3177 (2006.01)
(52) U.S. Cl.
CPC ......... G01R 31/31727 (2013.01); G01R 31/3177 (2013.01); G01R 31/31703 (2013.01)
(58) Field of Classification Search
CPC .... G01R 31/318552; G01R 31/318536; G01R 31/318544
See application file for complete search history.

(56) References Cited

U.S. PATENT DOCUMENTS 6,327,684 B1 * 12/2001 Nadeau-Dostie et al. ........
G01R 31/3016
714/731
8,074,133 B2 * 12/2011 Ziaja .................. G06F 11/24
714/731

(Continued)

FOREIGN PATENT DOCUMENTS

JP 2004-077356 A 3/2004
JP 2013-007618 A 1/2013

(Continued)

OTHER PUBLICATIONS

S. Bhuyan, M. Jain and P. T. N., "Estimating Stuck at Coverage percentage through scan flops during scan," 2019 International Conference on Vision Towards Emerging Trends in Communication and Networking (ViTECoN), Vellore, India, 2019, pp. 1-4. (Year: 2019).*

(Continued)

Primary Examiner — Cynthia Britt
(74) Attorney, Agent, or Firm — Allen & Overy LLP

(57) ABSTRACT

According to one embodiment, a semiconductor device includes a control circuit configured to generate a first signal and a second signal, a gating circuit configured to execute supply or stoppage of supply of a clock signal based on the first signal, and a circuit block configured to accept the clock signal, the second signal, and a test pattern. The gating circuit is configured to execute resupply of the clock signal after the stoppage of the supply, based on the first signal during a period of a scan test.

18 Claims, 13 Drawing Sheets

(56) References Cited

U.S. PATENT DOCUMENTS

| | | | |
|---|---|---|---|
| 8,677,201 B2 | 3/2014 | Itou | |
| 2006/0015786 A1* | 1/2006 | Mitra | G01R 31/318536 |
| | | | 714/724 |
| 2011/0320160 A1* | 12/2011 | Kosugi | G01R 31/31813 |
| | | | 702/120 |
| 2014/0289576 A1 | 9/2014 | Maekawa | |
| 2018/0203067 A1* | 7/2018 | Chen | G01R 31/318536 |
| 2019/0293719 A1 | 9/2019 | Sugimoto | |

FOREIGN PATENT DOCUMENTS

| | | |
|---|---|---|
| JP | 2014-185981 A | 10/2014 |
| JP | 2019-168297 A | 10/2019 |

OTHER PUBLICATIONS

A. Karputkin and J. Raik, "A synthesis-agnostic behavioral fault model for high gate-level fault coverage," 2016 Design, Automation & Test in Europe Conference & Exhibition (DATE), Dresden, Germany, 2016, pp. 1124-1127. (Year: 2016).*

H. Furukawa et al., "CTX: A Clock-Gating-Based Test Relaxation and X-Filling Scheme for Reducing Yield Loss Risk in At-Speed Scan Testing," 2008 17th Asian Test Symposium, Hokkaido, Japan, 2008, pp. 397-402. (Year: 2008).*

\* cited by examiner

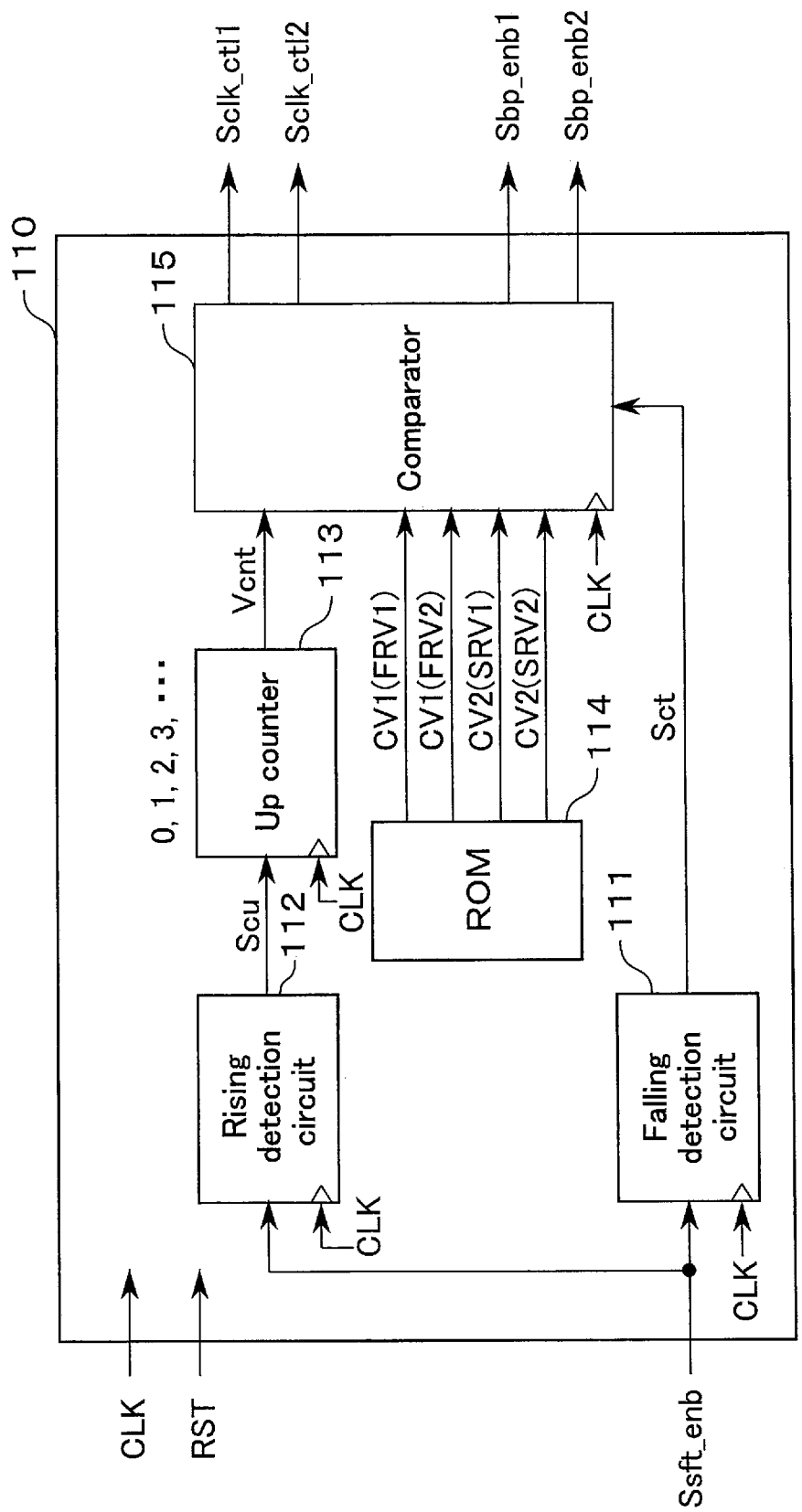
F I G. 3

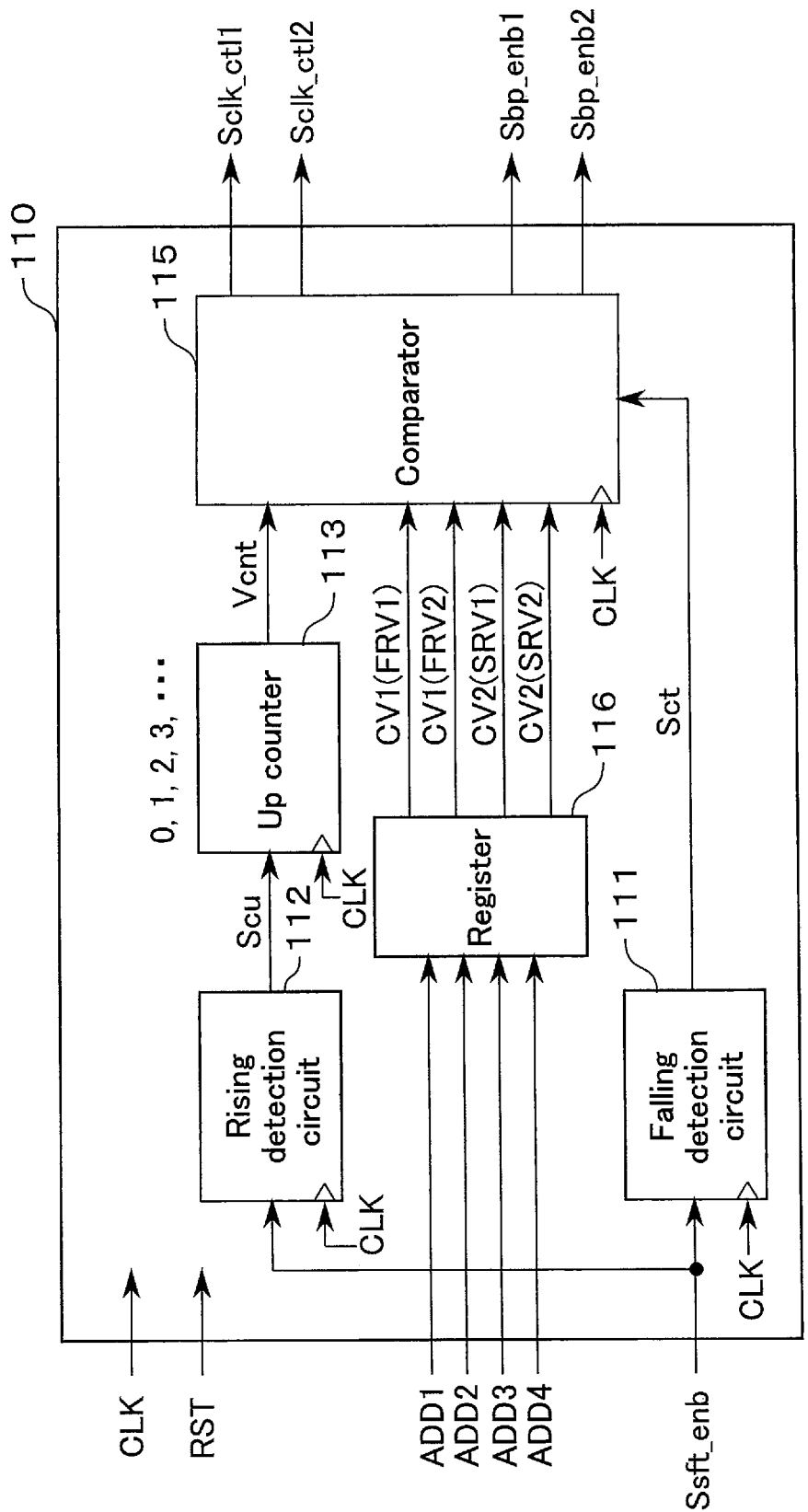
F I G. 8

| ADD | Set value |
|---|---|
| ADD1 | 100 |
| ADD2 | 500 |
| ADD3 | 200 |
| ADD4 | 600 |
| ⋮ | ⋮ |
F I G. 9
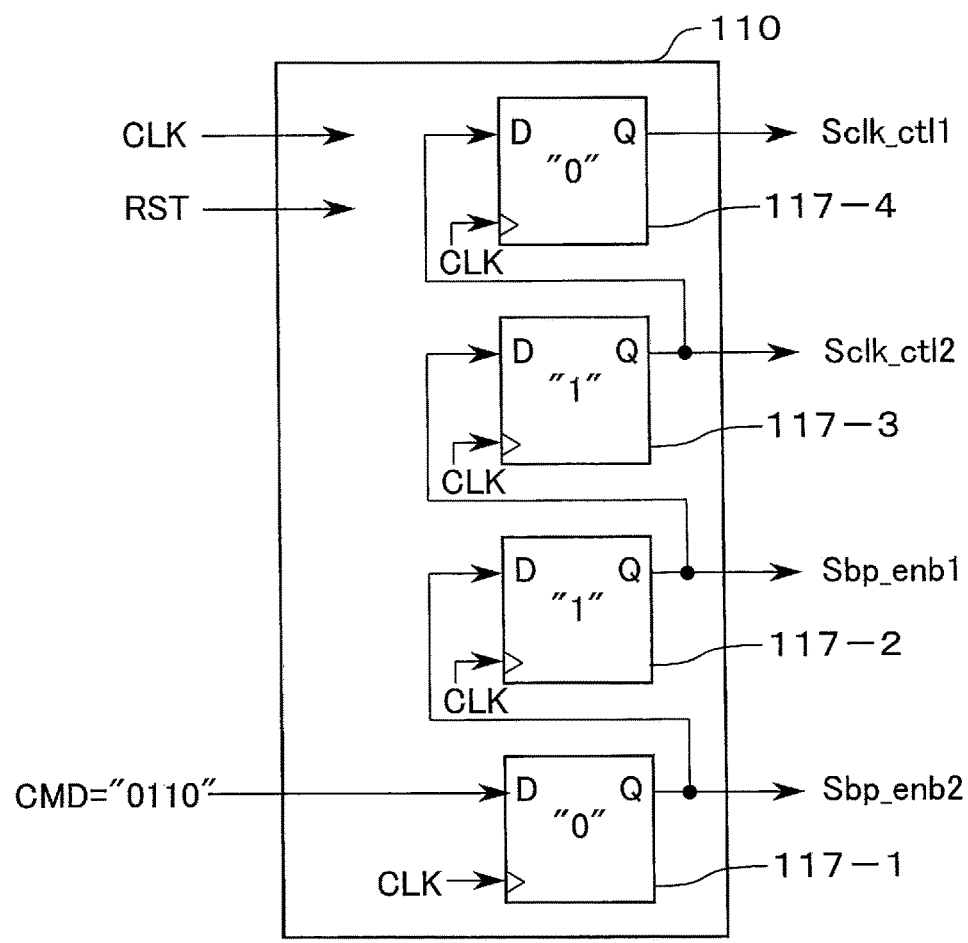
F I G. 10

SEMICONDUCTOR DEVICE FOR CONTROLLING SUPPLY OF CLOCK SIGNAL

CROSS-REFERENCE TO RELATED APPLICATIONS

This application is based upon and claims the benefit of priority from Japanese Patent Application No. 2020-049250, filed Mar. 19, 2020, the entire contents of which are incorporated herein by reference.

FIELD

Embodiments described herein relate generally to a semiconductor device.

BACKGROUND

Use of scan-designing circuit blocks using flip flops is a known technique for efficient implementation of LSI tests.

BRIEF DESCRIPTION OF THE DRAWINGS

FIG. 3 is a block diagram of a control circuit included in the semiconductor device according to the embodiment.

FIG. 8 is a block diagram of a control circuit included in a semiconductor device according to a first modification of the embodiment.

FIG. 9 is a schematic view of a table written in a register included in the control circuit shown in FIG. 8.

FIG. 10 is a block diagram of a control circuit included in a semiconductor device according to a second modification of the embodiment.

DETAILED DESCRIPTION

Figure 1:
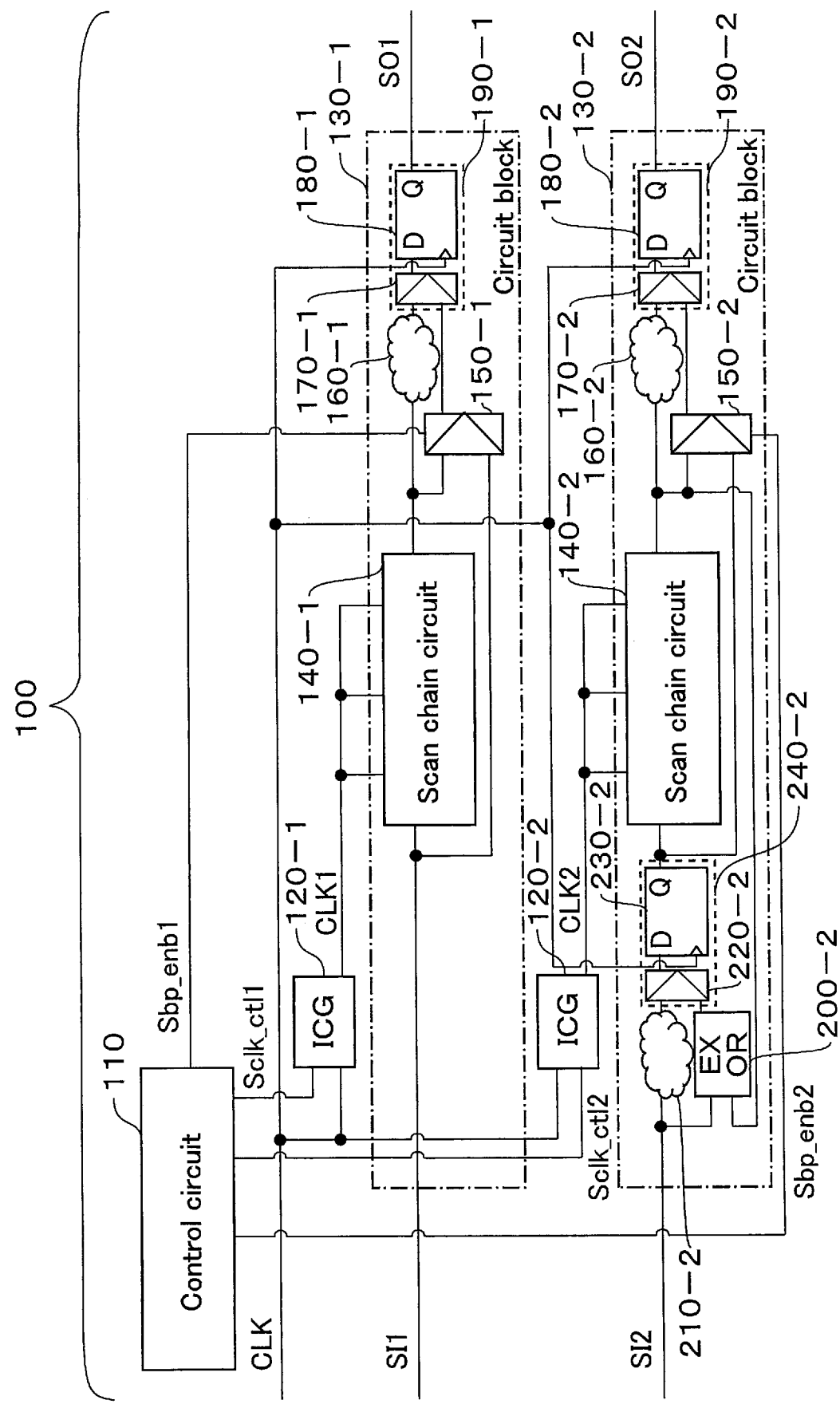
FIG. 1 is a block diagram of a semiconductor device according to one embodiment.

In general, according to one embodiment, a semiconductor device includes a control circuit configured to generate a first signal and a second signal, a gating circuit configured to execute supply or stoppage of supply of a clock signal based on the first signal, and a circuit block configured to accept the clock signal, the second signal, and a test pattern. The circuit block includes a scan chain circuit configured to retrieve the test pattern based on the clock signal, and a selection circuit configured to select, based on the second signal, a third signal output from the scan chain circuit or a fourth signal to be input to the scan chain circuit. The gating circuit is configured to execute resupply of the clock signal after the stoppage of the supply, based on the first signal during a period of a scan test.

Hereinafter, embodiments will be described with reference to the drawings. In the following description, constituent elements having the same function and configuration will be assigned common reference numerals.

1. Embodiment

A semiconductor memory device according to one embodiment will be described. A semiconductor device described hereinafter as one example includes scan chain circuits each having flip flops (FFs) and combinational circuits, and has both a function of bypassing a scan chain circuit in which a fault detection in a combinational circuit has been completed, and a function of controlling supply and stoppage of supply of clock signals to FFs.

1.1 Configuration

1.1.1 Overall Configuration of Semiconductor Device

First, an overall configuration of a semiconductor device according to the present embodiment will be described with reference to FIG. 1.

As shown in FIG. 1, a semiconductor device 100 includes a control circuit 110, a plurality of integrated clock gating circuits (hereinafter, referred to as "ICGs") 120 (two ICGs, i.e., ICGs 120-1 and 120-2 in the example shown in FIG. 1) and a plurality of circuit blocks 130 (two circuit blocks, i.e., circuit blocks 130-1 and 130-2 in the example shown in FIG. 1). The example of FIG. 1 illustrates part of signals input from a tester (not shown) to the semiconductor device 100 when a test is performed. The number of ICGs 120 and the number of circuit blocks 130 are not respectively limited to two.

The control circuit 110 controls operation of the ICGs 120-1 and 120-2 and the circuit blocks 130-1 and 130-2. More specifically, the control circuit 110 generates signals Sclk_ctl1 and Sclk_ctl2 for controlling operation of the ICGs 120-1 and 120-2, respectively. The control circuit 110 transmits the generated signals Sclk_ctl1 and Sclk_ctl2 to the ICGs 120-1 and 120-2, respectively. In the following description, the signals Sclk_ctl1 and Sclk_ctl2 will be simply referred to as "signal Sclk_ctl" when not distinguished from each other. The control circuit 110 generates signals Sbp_enb1 and Sbp_enb2 for controlling operation of the circuit blocks 130-1 and 130-2, respectively. The control circuit 110 transmits the generated signals Sbp_enb1 and Sbp_enb2 to the circuit blocks 130-1 and 130-2, respectively. In the following description, the signals Sbp_enb1 and Sbp_enb2 will be simply referred to as "signal Sbp_enb" when not distinguished from each other.

In other words, for example, when the number of ICGs 120 is N (N is a natural number no lower than 2), the control circuit 110 generates N signals Sclk_ctl respectively corresponding to the N ICGs 120. The control circuit 110 then transmits the generated N signals Sclk_ctl to the N ICGs 120, respectively. For example, when the number of circuit blocks 130 is N, the control circuit 110 generates N signals Sbp_enb respectively corresponding to the N circuit blocks 130. The control circuit 110 then transmits the generated N signals Sbp_enb to the N circuit blocks 130, respectively.

The ICG 120-1 receives a clock signal CLK from, e.g., the tester. In response to the signal Sclk_ctl1 transmitted from the control circuit 110, the ICG 120-1 transmits a signal CLK1 based on the signal CLK to the circuit block 130-1. Namely, in response to the signal Sclk_ctl1, the ICG 120-1 supplies or stops supplying the signal CLK to the corresponding circuit block 130-1. Similarly, the ICG 120-2 receives the signal CLK from, e.g., the tester. In response to the signal Sclk_ctl2 transmitted from the control circuit 110, the ICG 120-2 transmits a signal CLK2 based on the signal CLK to the circuit block 130-2. Namely, in response to the signal Sclk_ctl2, the ICG 120-2 supplies or stops supplying the signal CLK to the corresponding circuit block 130-2.

More specifically, for example, upon receipt of the signal Sclk_ctl1 of high ("H") level transmitted from the control circuit 110, the ICG 120-1 transmits the signal CLK as the signal CLK1 to the circuit block 130-1. On the other hand, upon receipt of the signal Sclk_ctl1 of low. ("L") level transmitted from the control circuit 110, the ICG 120-1 transmits a signal of level "L" as the signal CLK1 to the circuit block 130-1. Namely, the ICG 120-1 stops supplying the signal CLK to the circuit block 130-1. Similarly, for example, upon receipt of the signal Sclk_ctl2 of level "H" transmitted from the control circuit 110, the ICG 120-2 transmits the signal CLK as the signal CLK2 to the circuit block 130-2. On the other hand, upon receipt of the signal Sclk_ctl2 of level "L" transmitted from the control circuit 110, the ICG 120-2 transmits a signal of level "L" as the signal CLK2 to the circuit block 130-2. Namely, the ICG 120-2 stops supplying the signal CLK to the circuit block 130-2.

The circuit block 130-1 receives an input signal SI1 from, e.g., the tester. For example, in a scan test, the circuit block 130-1 receives a test pattern in the form of the signal SI1. In response to the signal Sbp_enb1 transmitted from the control circuit 110 and the signal CLK1 transmitted from the ICG 120-1, the circuit block 130-1 outputs an output signal SO1 to, e.g., the tester.

The circuit block 130-1 includes, for example, a scan chain circuit 140-1, a selection circuit 150-1, a combinational circuit 160-1, and a scan cell 190-1. The scan cell 190-1 includes a MUX 170-1 and a D flip flop (hereinafter, referred to as "D-FF") 180-1.

The input signal SI1 is input to the scan chain circuit 140-1. Output signals from the scan chain circuit 140-1 are input to one of the input terminals of the selection circuit 150-1, and the combinational circuit 160-1.

The scan chain circuit 140-1 includes a plurality of scan cells (not shown) in which D-FFs are scan-designed. As in the scan cell 190-1, these scan cells respectively include, e.g., D-FFs and MUXs. In this embodiment, scan-designing means connecting D-FFs of the scan cells in serial. The signal CLK1 is input to each scan cell. The scan chain circuit 140-1 will be described later in detail.

Based on the signal Sbp_enb1 transmitted from the control circuit 110, the selection circuit 150-1 transmits to the MUX 170-1 an output signal from the scan chain circuit 140-1 or the input signal SI1.

More specifically, one of the input terminals of the selection circuit 150-1 receives input of the output signal from the scan chain circuit 140-1, and the other input terminal receives input of the input signal SI1 via a bypass route of the scan chain circuit 140-1 (a route through which an input signal to the scan chain circuit 140-1 is input to the selection circuit 150-1). An output signal from the selection circuit 150-1 is input to one of the input terminals of the MUX 170-1 within the scan cell 190-1. For example, if the control circuit 110 transmits the signal Sbp_enb1 of level "L", the selection circuit 150-1 selects the output signal from the scan chain circuit 140-1. On the other hand, if the control circuit 110 transmits the signal Sbp_enb1 of level "H", the selection circuit 150-1 selects the input signal SI1.

The combinational circuit 160-1 operates based on the output signal from the scan chain circuit 140-1. An output signal from the combinational circuit 160-1 is input to the other input terminal of the MUX 170-1.

Based on a shift enable signal Ssft_enb (not shown) transmitted from the tester, the MUX 170-1 transmits to the D-FF 180-1 the output signal from the combinational circuit 160-1 or the output signal from the selection circuit 150-1. The signal Ssft_enb will be described later in detail.

The D-FF 180-1 retrieves an output signal from the MUX 170-1 when the signal CLK rises from level "L" to level "H". The D-FF 180-1 outputs a held value as the output signal SO1.

Next, the circuit block 130-2 will be described.

The circuit block 130-2 receives an input signal SI2 from, e.g., the tester. For example, in a scan test, the circuit block 130-2 receives a test pattern in the form of the signal SI2. In response to the signal Sbp_enb2 transmitted from the control circuit 110 and the signal CLK2 transmitted from the ICG 120-2, the circuit block 130-2 outputs an output signal SO2 to, e.g., the tester.

The circuit block 130-2 includes, for example, a scan chain circuit 140-2, a selection circuit 150-2, combinational circuits 160-2 and 210-2, scan cells 190-2 and 240-2, and an EXOR circuit 200-2. The scan cell 190-2 includes a MUX 170-2 and a D-FF 180-2. The scan cell 240-2 includes a MUX 220-2 and a D-FF 230-2.

The EXOR circuit 200-2 performs EXOR operation of the input signal SI2 and an output signal from the scan chain circuit 140-2. The EXOR circuit 200-2 transmits an operation result to one of the input terminals of the MUX 220-2.

The combinational circuit 210-2 operates based on the input signal SI2. An output signal from the combinational circuit 210-2 is input to the other input terminal of the MUX 220-2.

Based on the signal Ssft_enb (not shown) transmitted from the tester, the MUX 220-2 transmits the output signal from the combinational circuit 210-2 or an output signal from the EXOR circuit 200-2 to the D-FF 230-2.

The D-FF 230-2 retrieves an output signal from the MUX 220-2 when the signal CLK rises from level "L" to level "H". The D-FF 230-2 transmits a held value to the scan chain circuit 140-2 and one of the input terminals of the selection circuit 150-2.

An output signal from the D-FF 230-2 is input to the scan chain circuit 140-2. An output signal from the scan chain circuit 140-2 is input to the other input terminal of the selection circuit 150-2 and the combinational circuit 160-2. As in the scan chain circuit 140-1, the scan chain circuit 140-2 includes a plurality of scan cells (not shown) in which D-FFs are scan-designed. The signal CLK2 is input to each scan cell.

Based on the signal Sbp_enb2 transmitted from the control circuit 110, the selection circuit 150-2 transmits to the MUX 170-2 the output signal from the scan chain circuit 140-2 or an input signal to the D-FF 230-2.

More specifically, one of the input terminals of the selection circuit 150-2 receives input of the output signal from the D-FF 230-2 via a bypass circuit of the scan chain circuit 140-2 (a route through which an input signal to the scan chain circuit 140-2 is input to the selection circuit 150-2), and the other input terminal receives input of the output signal from the scan chain circuit 140-2. An output signal from the selection circuit 150-2 is input to one of the input terminals of the MUX 170-2 within the scan cell 190-2. For example, upon receipt of the signal Sbp_enb2 of level "L" transmitted from the control circuit 110, the selection circuit 150-2 selects the output signal from the scan chain circuit 140-2. On the other hand, upon receipt of the signal Sbp_enb2 of level "H" transmitted from the control circuit 110, the selection circuit 150-2 selects the output signal from the D-FF 230-2.

The combinational circuit 160-2 operates based on the output signal from the scan chain circuit 140-2. An output signal from the combinational circuit 160-2 is input to the other input terminal of the MUX 170-2.

Based on the signal Ssft_enb (not shown) transmitted from a tester, the MUX 170-2 transmits the output signal from the combinational circuit 160-2 or the output signal from the selection circuit 150-2 to the D-FF 180-2.

The D-FF 180-2 retrieves an output signal from the MUX 170-2 when the signal CLK rises from level "L" to level "H". The D-FF 180-2 outputs a held value as the output signal SO2.

1.1.2 Configuration of Scan Chain Circuits 140 (140-1 and 140-2)

Next, a configuration of scan chain circuits 140 included in the semiconductor device 100 according to the present embodiment will be described in detail with reference to FIG. 2. Hereinafter, the scan chain circuit 140-1 will be described as one example.

Figure 2:
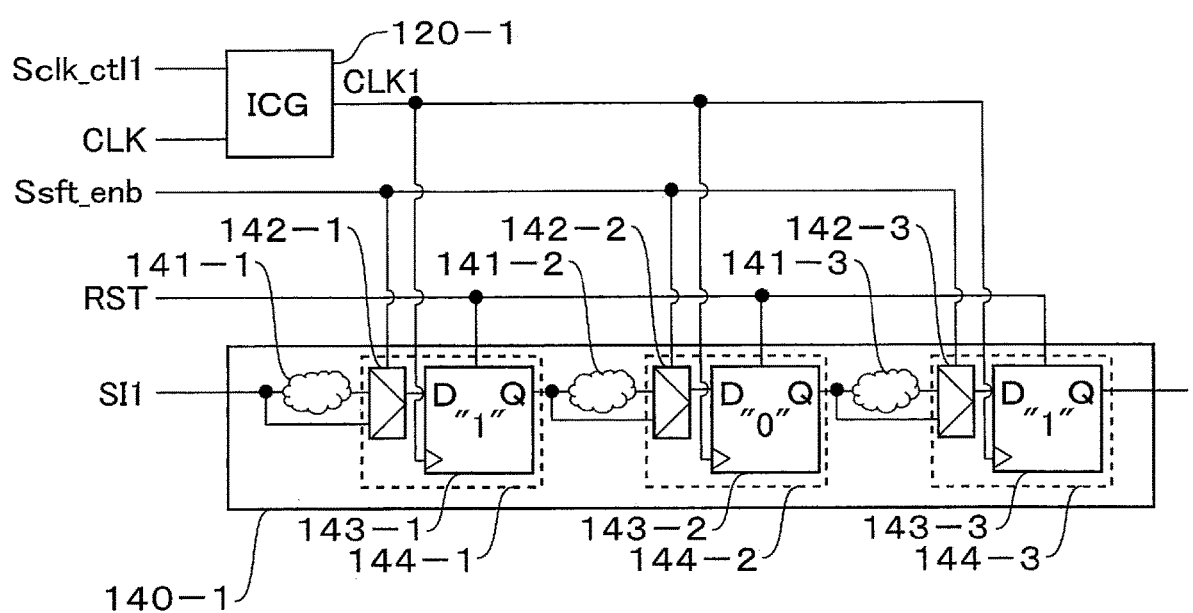
FIG. 2 is a block diagram of a scan chain circuit included in the semiconductor device according to the embodiment.

As shown in FIG. 2, the scan chain circuit 140-1 includes a plurality of combinational circuits 141 (three combinational circuits 141-1 to 141-3 in the example shown in FIG. 2) and a plurality of scan cells 144 (three scan cells 144-1 to 144-3 in the example shown in FIG. 2). The scan cells 144 respectively include MUXs 142 and D-FFs 143. More specifically, the scan cell 144-1 includes the MUX 142-1 and the D-FF 143-1. The scan cell 144-2 includes the MUX 142-2 and the D-FF 143-2. The scan cell 144-3 includes the MUX 142-3 and the D-FF 143-3. As a matter of course, the number of combinational circuits 141 and the number of scan cells 144 are freely selected, and the scan chain circuit 140-1 may have any configuration as long as D-FFs within the respective scan cells 144 are scan-designed. Output of the scan cells 144-1 to 144-3 may be connected to other combinational circuits not shown in FIGS. 1 and 2.

The combinational circuits 141-1 to 141-3 are subject to a scan test. The combinational circuit 141-1 operates based on the signal SI1 transmitted from a tester (not shown). An output signal from the combinational circuit 141-1 is input to the scan cell 144-1. The combinational circuit 141-2 operates based on an output signal from the scan cell 144-1. An output signal from the combinational circuit 141-2 is input to the scan cell 144-2. The combinational circuit 141-3 operates based on an output signal from the scan cell 144-2. An output signal from the combinational circuit 141-3 is input to the scan cell 144-3. The combinational circuits 141-1 to 141-3 may be the same or different in configuration.

The MUX 142-1 of the scan cell 144-1 receives the signal SI1 and the output signal from the combinational circuit 141-1. The MUX 142-1 selects the signal SI1 or the output signal from the combinational circuit 141-1 in accordance with the shift enable signal Ssft_enb transmitted from the tester. The signal Ssft_enb is a signal for controlling shift operation and capture operation in a scan test. Shift operation and capture operation will be described later in detail. The MUX 142-1 transmits the selected signal to the D-FF 143-1 of the scan cell 144-1.

The D-FF 143-1 of the scan cell 144-1 retrieves the signal transmitted from the MUX 142-1 when the signal CLK transmitted from the ICG 120-1 rises from level "L" to level "H". The D-FF 143-1 outputs a held value to the MUX 142-2 of the scan cell 144-2 and the combinational circuit 141-2. The D-FF 143-1 resets a held value in accordance with a reset signal RST transmitted from the tester. The signal RST is a signal for controlling whether to reset a value held in the D-FF 143-1.

The MUX 142-2 of the scan cell 144-2 receives an output signal from the D-FF 143-1 of the scan cell 144-1 and an output signal from the combinational circuit 141-2. In accordance with the signal Ssft_enb, the MUX 142-2 selects the output signal from the D-FF 143-1 or the output signal from the combinational circuit 141-2. The MUX 142-2 transmits the selected signal to the D-FF 143-2 of the scan cell 144-2.

The D-FF 143-2 of the scan cell 144-2 retrieves the signal transmitted from the MUX 142-2 when the signal CLK rises from level "L" to level "H". The D-FF 143-2 outputs a held value to the MUX 142-3 of the scan cell 144-3 and the combinational circuit 141-3. The D-FF 143-2 resets a held value in accordance with the signal RST.

The MUX 142-3 of the scan cell 144-3 receives an output signal from the D-FF 143-2 of the scan cell 144-2 and an output signal from the combinational circuit 141-3. In accordance with the signal Ssft_enb, the MUX 142-3 selects the output signal from the D-FF 143-2 or the output signal from the combinational circuit 141-3. The MUX 142-3 transmits the selected signal to the D-FF 143-3 of the scan cell 144-3.

The D-FF 143-3 of the scan cell 144-3 retrieves the signal transmitted from the MUX 142-3 when the signal CLK rises from level "L" to level "H". The D-FF 143-3 outputs a held value to, for example, the selection circuit 150-1 and the combinational circuit 160-1 both shown in FIG. 1. The D-FF 143-3 resets a held value in accordance with the signal RST.

A scan test includes shift operation and capture operation. The shift operation sets values to the scan cells 144 and takes out the values from the scan cells 144. The capture operation drives the combinational circuits 141, thereby causing the scan cells 144 to retrieve output signals from the combinational circuits 141. The scan test repeats a sequence of the shift operation and the capture operation by the number of test patterns (the number of times a test is performed). Hereinafter, the scan chain circuit 140-1 will be described in more detail by referring to operation performed in the scan test, as an example.

For example, in the shift operation included in the Mth test (M is a natural number no lower than 1), the semiconductor device 100 receives the signal Ssft_enb of level "H" and a test pattern in the form of the signal SI1 from the tester, for example. Based on the signal Ssft_enb of level "H", the MUX 142-1 selects the signal SI1. The MUX 142-2 receives an output signal from the scan cell 144-1. The MUX 142-3 selects an output signal from the scan cell 144-2. The MUXs 142-1 to 142-3 transmit the selected signals to the D-FFs 143-1 to 143-3, respectively. The D-FFs 143-1 to 143 respectively retrieve output signals from the MUXs 142-1 to 142-3 when the signal CLK rises from level "L" to level "H". In the case where the test pattern (for example, "101") is set to the scan cells 144-1 to 144-3, the semiconductor device 100 performs the shift operation three times during one test. In this manner, "1" is set to the scan cell 144-3, "0" is set to the scan cell 144-2, and "1" is set to the scan cell 144-1.

Next, in the capture operation included in the Mth test, the semiconductor device 100 receives the signal Ssft_enb of level "L" from the tester, for example. Based on the signal Ssft_enb of level "L", the semiconductor device 100 drives the combinational circuits 141-1 to 141-3. At this time, the MUX 142-1 selects an output signal from the combinational circuit 141-1. The MUX 142-2 selects an output signal from the combinational circuit 141-2. The MUX 142-3 selects an output signal from the combinational circuit 141-3. The MUXs 142-1 to 142-3 transmit the selected signals to the D-FFs 143-1 to 143-3, respectively. The D-FFs 143-1 to 143-3 respectively retrieve output signals from the MUXs 142-1 to 142-3 when the signal CLK rises from level "L" to level "H". This causes the scan cells 144-1 to 144-3 to respectively retrieve the output signals from the combinational circuits 141-1 to 141-3.

Next, in the shift operation included in the (M+1)th test, bits for the (M+1)th test pattern are respectively set to the scan cells 144-1 to 144-3, and values held in the scan cells 144-1 to 144-3 (the output signals from the combinational circuits 141-1 to 141-3 in the Mth test) are output from the scan cell 144-3.

1.1.3 Configuration of Control Circuit 110

Next, the configuration of the control circuit 110 included in the semiconductor device 100 according to the present embodiment will be described in detail with reference to FIG. 3.

As shown in FIG. 3, the control circuit 110 includes a falling detection circuit 111, a rising detection circuit 112, an up counter 113, an ROM (Read Only Memory) 114, and a comparator 115.

The falling detection circuit 111 receives the signal Ssft_enb and the signal CLK transmitted from a tester (not shown). The falling detection circuit 111 detects whether or not the signal Ssft_enb is at level "L" when the signal. CLK rises from level "L" to level "H". The falling detection circuit ill transmits a comparison timing signal Sct in accordance with a detection result, to the comparator 115. More specifically, for example, in the case that the signal Ssft_enb is detected to be at level "L", when the signal CLK rises from level "L" to level "H", the falling detection circuit 111 raises the signal Sct from level "L" to level "H", thereby transmitting the signal Sct of level "H" to the comparator 115. After one cycle on from the rising of the signal CLK, that is, when the signal CLK rises from level "L" to level "H", the falling detection circuit 111 causes the signal Sct to fall from level "H" to level "L". On the other hand, in the case of the signal Ssft_enb not being detected to be at level "L", the falling detection circuit 111 transmits the signal Sct of level "L" to the comparator 115.

The rising detection circuit 112 receives the signal Ssft_enb and the signal CLK. When the signal CLK rises from level "L" to level "H", the rising detection circuit 112 detects whether or not the signal Ssft_enb is at level "H". The rising detection circuit 112 transmits a count up timing signal Scu in accordance with a detection result to the up counter 113. More specifically, for example, in the case that the signal Ssft_enb is detected to be at level "H", when the signal CLK rises from level "L" to level "H", the rising detection circuit 112 raises the signal Scu from level "L" to level "H", thereby transmitting the signal Scu of level "H" to the up counter 113. After one cycle on from the rising of the signal CLK, that is, when the signal CLK rises from level "L" to level "H", the rising detection circuit 112 causes the signal Scu to fall from level "H" to level "L". On the other hand, in the case of the signal Ssft_enb not being detected to be at level "H", the rising detection circuit 112 transmits the signal. Scu of level "L" to the up counter 113.

The up counter 113 receives the signal Scu transmitted from the rising detection circuit 112. For example, in the case of the signal Scu being at level "H", when the signal Scu falls from level "H" to level "L", the up counter 113 increases by 1 a counter value Vcnt indicative of the number of test patterns. On the other hand, in the case of the signal Scu being at level "L", the up counter 113 does not increase the counter value Vcnt (maintains an existing value). The up counter 113 holds the counter value Vcnt. The up counter 113 transmits the held counter value Vcnt to the comparator 115. The counter value Vcnt is reset in accordance with the signal RST transmitted from the tester.

The ROM 114 stores comparison values CV1 and CV2 for the number of test patterns, which the comparator 115 compares with the counter value Vcnt. The comparison value CV1 is a value for use in testing the circuit block 130-1 shown in FIG. 1. The comparison value CV2 is a value for use in testing the circuit block 130-2 shown in FIG. 1. Both a first reference value and a second reference value (the first reference value<the second reference value) are stored for each of the comparison values CV1 and CV2.

For example, a first reference value FRV1 of the comparison value CV1 corresponds to the number of test patterns, and supply of the signal CLK is stopped when the number of test patterns reaches the first reference value FRV1. That is, the first reference value FRV1 is a reference value for the tester to determine that fault detection in the combinational circuits 141-1 to 141-3 of the scan chain circuit 140-1 has been completed. For example, a second reference value FRV2 of the comparison value CV1 corresponds to the number of test patterns, and the signal CLK is resupplied when the number of test patterns reaches the second reference value FRV2. Similarly, a first reference value SRV1 of the comparison value CV2 corresponds to the number of test patterns, and supply of the signal CLK is stopped when the number of test patterns reaches the first reference value SRV1. A second reference value SRV2 of the comparison value CV2 corresponds to the number of test patterns, and the signal CLK is resupplied when the number of test patterns reaches the second reference value SRV2. The first reference value FRV1 of the comparison value CV1 may be equal to or different from the first reference value SRV1 of the comparison value CV2. Similarly, the second reference value FRV2 of the comparison value CV1 may be equal to or different from the second reference value SRV2 of the comparison value CV2. If the number of ICGs 120 and the number of circuit blocks 130 are each N, there are N comparison values CV1 to CVN, and both the first reference value and the second reference value are prepared for each of the N comparison values CV1 to CVN.

The comparator 115 receives the signal Sct transmitted from the falling detection circuit 111 and the counter value Vcnt transmitted from the up counter 113. Upon receipt of the signal Sct of level "H", the comparator 115 compares the counter value Vcnt with each of the first reference value FRV1 and the second reference value FRV2 of the comparison value CV1 acquired from the ROM 114. The comparator 115 compares the counter value Vcnt with each of the first reference value SRV1 and the second reference value SRV2 of the comparison value CV2 acquired from the ROM 114. The comparator 115 generates signals Snxt_clk1 and Snxt_clk2, and signals Snxt_bp1 and Snxt_bp2 in accordance with comparison results. The signal Snxt_clk1 is a signal to set the signal Sclk_ctl1. The signal Snxt_clk2 is a signal to set the signal Sclk_ctl2. The signal Snxt_bp1 is a signal to set the signal Sbp_enb1. The signal Snxt_bp2 is a signal to set the signal Sbp_enb2. The comparator 115 holds the generated signals, i.e., the signals Snxt_clk1 and Snxt_clk2, and the signals Snxt_bp1 and Snxt_bp2. The signals Snxt_clk1 and Snxt_clk2, and the signals Snxt_bp1 and Snxt_bp2 will be described later in detail.

The comparator 115 generates the signals Sclk_ctl1 and Sclk_ctl2 and the signals Sbp_enb1 and Sbp_enb2 based on the counter value Vcnt indicative of the number of test patterns. Initial values of the signals Sclk_ctl1 and Sclk_ctl2 are, e.g., level "H", while initial values of the signals Sbp_enb1 and Sbp_enb2 are, e.g., level "L". The comparator 115 holds the generated signals, i.e., the signals Sclk_ctl1 and Sclk_ctl2, and the signals Sbp_enb1 and Sbp_enb2. The comparator 115 respectively transmits the held signals Sclk_ctl1 and Sclk_ctl2 to the ICGs 120-1 and 120-2 shown in FIG. 1, for example, and respectively transmits the held signals Sbp_enb1 and Sbp_enb2 to the selection circuits 150-1 and 150-2 shown in FIG. 1, for example.

When the signal Sct falls from level "H" to level "L", the comparator 115 sets the signals Snxt_clk1 and Snxt_clk2 and the signals Snxt_bp1 and Snxt_bp2 as the signals Sclk_ctl1 and Sclk_ctl2 and the signals Sbp_enb1 and Sbp_enb2, respectively. In this manner, the signals Sclk_ctl1 and Sclk_ctl2 and the signals Sbp_enb1 and Sbp_enb2 are generated. The comparator 115 outputs the signals Snxt_clk1 and Snxt_clk2 as the signals Sclk_ctl1 and Sclk_ctl2, respectively, and outputs the signals Snxt_bp1 and Snxt_bp2 as the signals Sbp_enb1 and Sbp_enb2, respectively.

1.2 Operation of Semiconductor Device 100

Figure 4A:
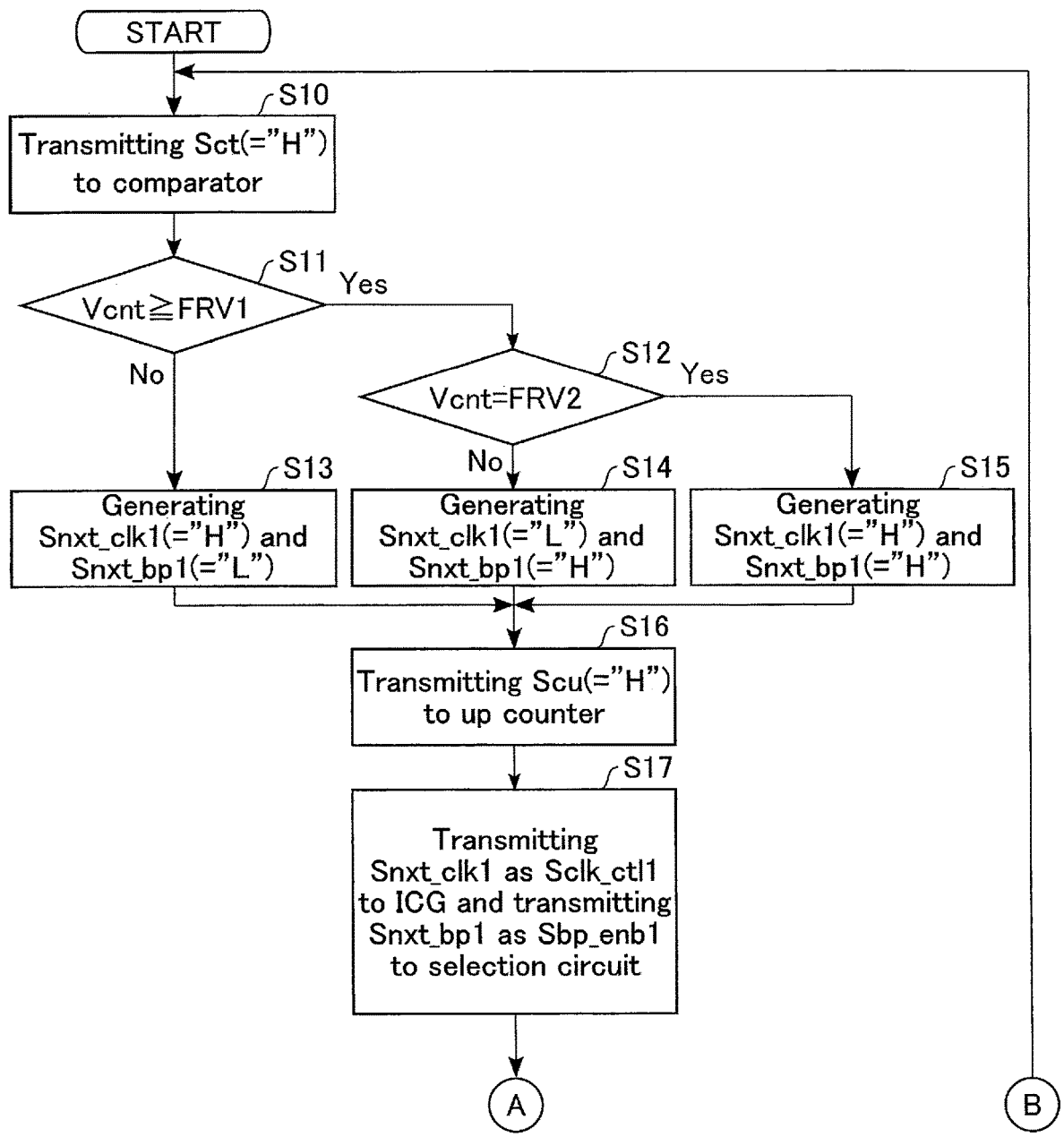
FIG. 4A is a flowchart showing operation during a period of a scan test on the semiconductor device according to the embodiment.
Figure 4B:
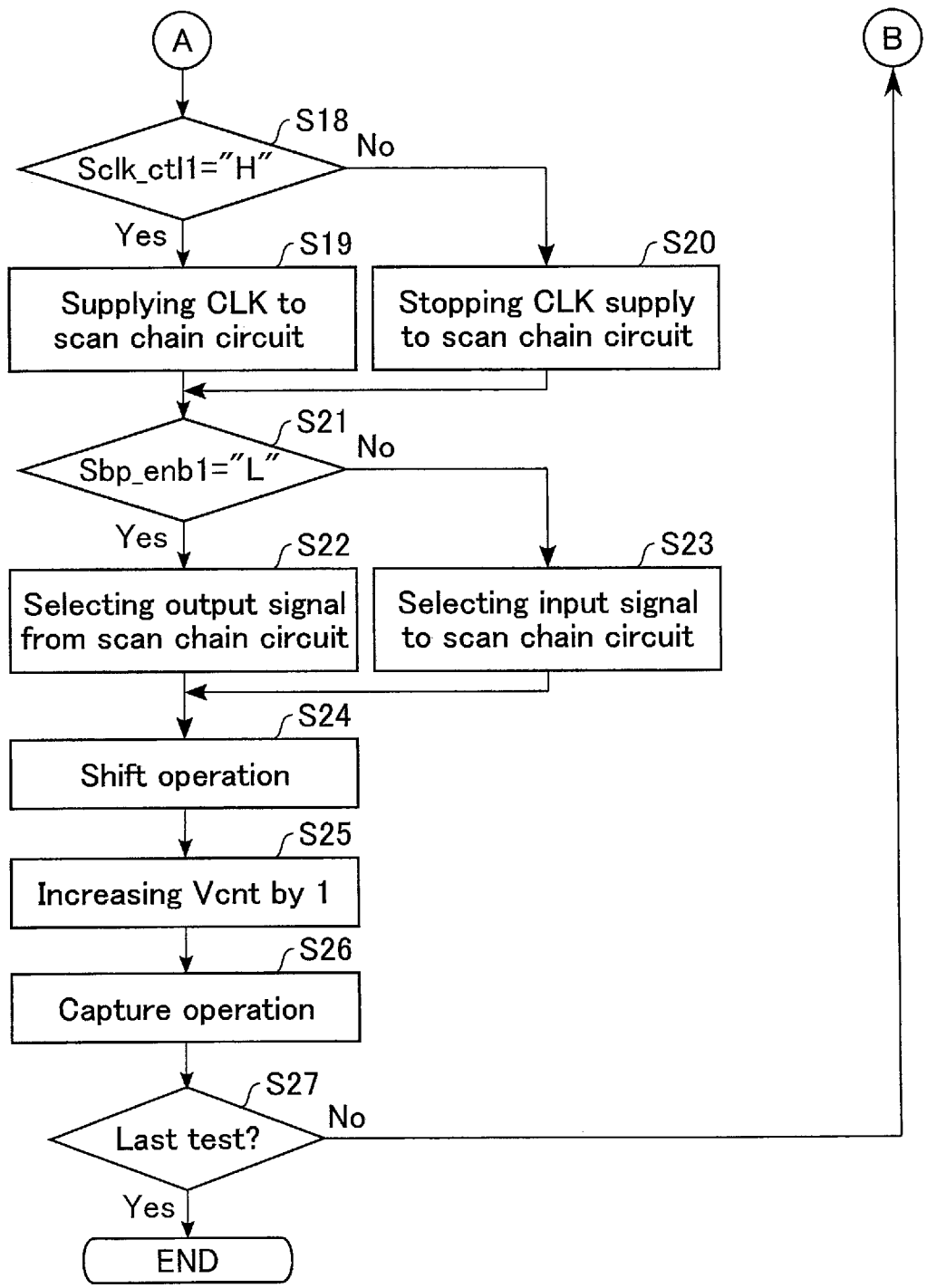
FIG. 4B is a flowchart showing operation during the period of the scan test on the semiconductor device according to the embodiment.

Next, operation of the semiconductor device 100 according to the present embodiment will be described with reference to FIGS. 4A, 4B, and 5. Hereinafter, the description will be given based on an exemplary case in which a scan test is performed on the circuit block 130-1 of the semiconductor device 100 according to the present embodiment. FIGS. 4A and 4B each illustrate a flowchart showing operation during a period of a scan test on the semiconductor device 100. In the present embodiment, examples of "a period of a scan test" include a period from when a test in the first test pattern begins to when implementation of a test in the last test pattern is completed, and a period from when a test in the first test pattern begins to when a fault coverage is saturated. Symbol A in FIG. 4A is continuous with symbol A in FIG. 4B in chronological order. Symbol B in FIG. 4B is continuous with symbol B in FIG. 4A in a chronological order. Operation during the period of a scan test on the circuit block 130-2 is the same as operation during the period of the scan test on the circuit block 130-1.

As shown in FIG. 4A, in the case that the signal Ssft_enb transmitted from a tester (not shown) is detected to be at level "L", the falling detection circuit ill transmits the signal Sct of level "H" to the comparator 115 (step S10). Upon receipt of the signal Sct of level "H", the comparator 115 acquires from the ROM 114 the first reference value FRV1 and the second reference value FRV2 of the comparison value CV1. The comparator 115 compares the counter value Vcnt transmitted from the up counter 113 with each of the first reference value FRV1 and the second reference value FRV2.

As a result of this comparison, if the counter value Vcnt is lower than the first reference value FRV1 (step S11, No), the comparator 115 generates the signal Snxt_clk1 of level "H" and the signal Snxt_bp1 of level "L" (step S13).

As a result of the above comparison, if the counter value Vcnt is equal to or greater than the first reference value FRV1 (step S11, Yes), and if the counter value Vcnt is not equal to the second reference value FRV2 (step S12, No), the comparator 115 generates the signal Snxt_clk1 of level "L" and the signal Snxt_bp1 of level "H" (step S14).

As a result of the above comparison, if the counter value Vcnt is equal to or greater than the first reference value FRV1 (step S11, Yes), and if the counter value Vcnt is equal to the second reference value (step S12, Yes), the comparator 115 generates the signal Snxt_clk1 of level "H" and the signal Snxt_bp1 of level "H" (step S15).

Next, upon detecting that the signal Ssft_enb is at level "H", the rising detection circuit 112 transmits the signal Scu of level "H" to the up counter 113 (step S16). The up counter 113 receives the signal Scu of level "H".

When the signal Sct falls from level "H" to level "L", the comparator 115 transmits as the signal Sclk_ctl1 the signal Snxt_clk1 generated in any of steps S13 to S15 to the ICG 120-1, and transmits as the signal Sbp_enb1 the signal Snxt_bp1 generated in any of steps S13 to S15 to the selection circuit 150-1 (step S17).

Subsequently, as shown in FIG. 4B, the ICG 120-1 receives the signal Sclk_ctl1 from the comparator 115. In the case of the signal Sclk_ctl1 being at level "H" (step S18, Yes), the ICG 120-1 supplies the signal CLK to the scan chain circuit 140-1 (step S19).

On the other hand, in the case of the signal Sclk_ctl1 being at level "L" (step S18, No), the ICG 120-1 stops supplying the signal CLK to the scan chain circuit 140-1 (step S20).

The selection circuit 150-1 receives the signal Sbp_enb1 from the comparator 115. In the case of the signal Sbp_enb1 being at level "L" (step S21, Yes), the selection circuit 150-1 selects an output signal from the scan chain circuit 140-1 (step S22).

On the other hand, in the case of the signal Sbp_enb1 being at level "H" (step S21, No), the selection circuit 150-1 selects an input signal to the scan chain circuit 140-1 (step S23).

Next, the semiconductor device 100 performs the shift operation based on a test pattern (step S24). More specifically, the tester transmits a test pattern in the form of the signal SI1 to the circuit block 130-1. The semiconductor device 100 performs the shift operation, thereby respectively setting bits for the test pattern to the scan cells 144-1 to 144-3 and 190-1.

Upon receipt of the signal Scu of level "H", the up counter 113 increases the counter value Vcnt by 1 when the signal Scu falls from level "H" to level "L" (step S25).

Subsequently, when the tester causes the signal Ssft_enb to fall from level "H" to level "L", the semiconductor device 100 performs the capture operation (step S26). More specifically, the semiconductor device 100 drives the combinational circuits 141-1 to 141-3 and 160-1, thereby causing the scan cells 144-1 to 144-3 and 190-1 to retrieve output signals from the combinational circuits 141-1 to 141-3 and 160-1.

Next, if the implemented test is not the last test (step S27, No), the semiconductor device 100 performs step S10 described above. On the other hand, if the implemented test is the last test (step S27, Yes), the semiconductor device 100 terminates the scan test.

Next, concrete examples of scan test operation will be described with reference to FIG. 5. FIG. 5 is a timing chart of various signals during the period of a scan test. As one example of the comparison value CV1 stored in the ROM 114, the first reference value FRV1 is set to 100, and the second reference value FRV2 is set to 500.

Figure 5:
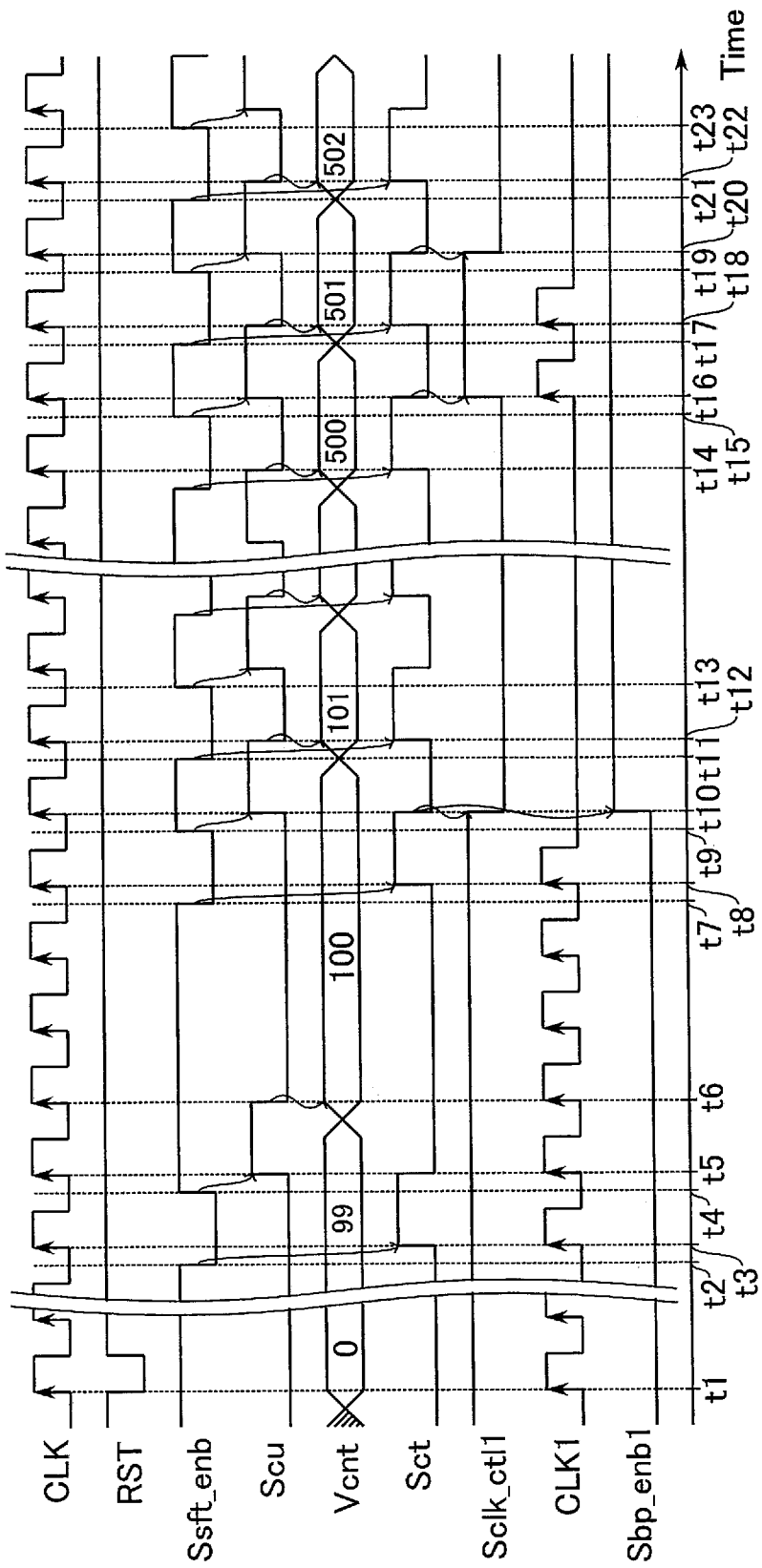
FIG. 5 is a timing chart of various signals during the period of the scan test on the semiconductor device according to the embodiment.

As shown in FIG. 5, at time t1, the tester raises the signal CLK from level "L" to level "H", and causes the signal RST to fall from level "H" to level "L". In this manner, the semiconductor device 100 initiates a scan test. Upon receipt of the signal RST of level "L" transmitted from the tester, the up counter 113 resets the counter value Vcnt to 0.

At time t2 in FIG. 5, the tester causes the signal Ssft_enb to fall from level "H" to level "L". In the case that the signal Ssft_enb transmitted from the tester is detected to be at level "L", at time t3, the falling detection circuit 111 raises the signal Sct from level "L" to level "H", thereby transmitting the signal Sct of level "H" to the comparator 115 (step S10 in FIG. 4A).

Upon receipt of the signal Sct of level "H", the comparator 115 acquires from the ROM 114 the first reference value FRV1 and the second reference value FRV2 of the comparison value CV1. The comparator 115 then compares the counter value Vcnt transmitted from the up counter 113 with each of the first reference value FRV1 and the second reference value FRV2. At time t3, since the counter value Vcnt (Vcnt=99) is lower than the first reference value FRV1 (step S11 in FIG. 4A, No), the comparator 115 generates the signal Snxt_clk1 of level "H" and the signal Snxt_bp1 of level "L" (step S13 in FIG. 4A).

At time t4 in FIG. 5, the tester raises the signal Ssft_enb from level "L" to level "H". Upon detecting that the signal Ssft_enb is at level "H", at time t5, the rising detection circuit 112 raises the signal Scu from level "L" to level "H", thereby transmitting the signal Scu of level "H" to the up counter 113 (step S16 in FIG. 4A).

At time t5 in FIG. 5, the falling detection circuit 111 causes the signal Sct to fall from level "H" to level "L". When the signal Sct falls from level "H" to level "L", the comparator 115 transmits as the signal Sclk_ctl1 the signal Snxt_clk1 of level "H" generated in step S13 in FIG. 4A to the ICG 120-1, thereby transmitting as the signal Sbp_enb1 the signal Snxt_bp1 of level "L" generated in step S13 in FIG. 4A to the selection circuit 150-1 (step S17 in FIG. 4A). The ICG 120-1 supplies the signal CLK to the scan chain circuit 140-1 (step S19 in FIG. 4B). The selection circuit 150-1 selects an output signal from the scan chain circuit 140-1 (step S22 in FIG. 4B).

During the period from time t5 to time t7 in FIG. 5, the semiconductor device 100 performs the shift operation based on the first test pattern (step S24 in FIG. 4B). During the period from time t5 to time t7, the tester transmits the first test pattern in the form of the signal SI1 to the circuit block 130-1. The semiconductor device 100 performs the shift operation, thereby respectively setting bits for the first test pattern to the scan cells 144-1 to 144-3 and 190-1.

Figure 6A:
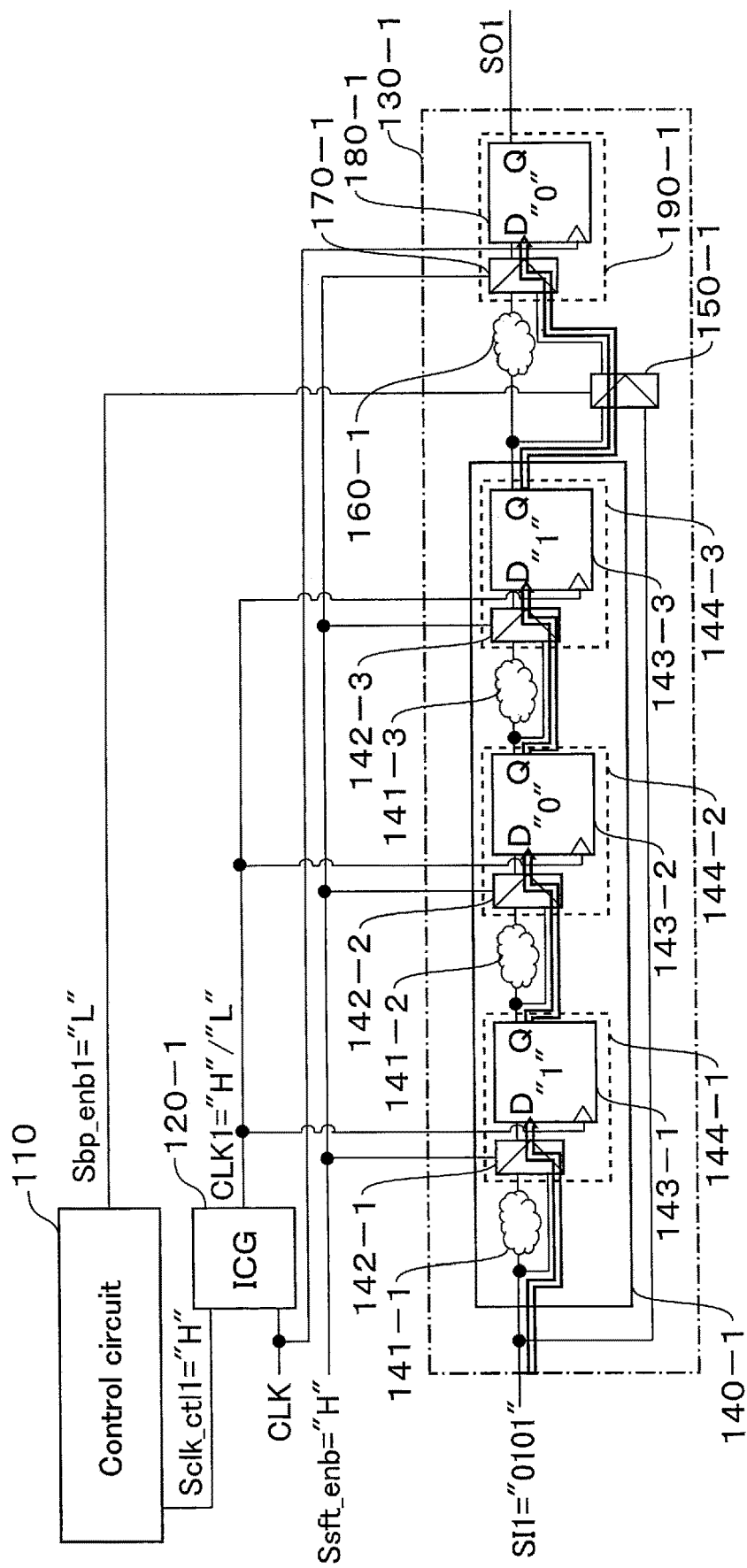
FIG. 6A is a block diagram of the semiconductor device according to the embodiment.

FIG. 6A shows how the semiconductor device 100 operates and signals are transferred when the tester transmits the first test pattern to the circuit block 130-1. FIG. 6A illustrates the state of the circuit block 130-1 when the first test pattern "0101" is transmitted to the circuit block 130-1. As shown in FIG. 6A, the shift operation is performed four times with the signal Ssft_enb at level "H", the signal Sclk_ctl1 at level "H", and the signal Sbp_enb1 at level "L". Accordingly, "0" is set to the scan cell 190-1, "1" is set to the scan cell 144-3, "0" is set to the scan cell 144-2, and "1" is set to the scan cell 144-1. In the case of the (M+1)th test (M being a natural number no lower than 1), for example, a result of the Mth test (values held in the scan cells 144-1 to 144-3 and 190-1) is output as the signal SO1. If the first test pattern is transmitted for the Mth test and (M+1)th test, the first test pattern for the (M+1)th test may be the same as or different from that for the Mth test.

At time t6 in FIG. 5, the rising detection circuit 112 causes the signal Scu to fall from level "H" to level "L". When the signal Scu falls from level "H" to level "L", the up counter 113 increases the counter value Vcnt by 1 (step S25 in FIG. 4B).

At time t7 in FIG. 5, the tester causes the signal Ssft_enb to fall from level "H" to level "L". During the period from time t8 to time t9, the semiconductor device 100 performs the capture operation (step S26 in FIG. 4B). During the period from time t8 to time t9, the semiconductor device 100 drives the combinational circuits 141-1 to 141-3 and 160-1, thereby causing the scan cells 144-1 to 144-3 and 190-1 to respectively retrieve output signals from the combinational circuits 141-1 to 141-3 and 160-1. Although not shown in FIG. 5, the operation performed during the period from time t1 to time t2 is similar to that performed during the period from time t2 to time t7.

At time t8 in FIG. 5, the comparator 115 compares the counter value Vcnt with each of the first reference value FRV1 and the second reference value FRV2. At time t8, the counter value Vcnt (Vcnt=100) is equal to or greater than the first reference value (step S11 in FIG. 4A, Yes), and the counter value Vcnt is not equal to the second reference value (step S12 in FIG. 4A, No). Thus, the comparator 115 generates the signal Snxt_clk1 of level "L" and the signal Snxt_bp1 of level "H" (step S14 in FIG. 4A).

At time t10 in FIG. 5, the falling detection circuit 111 causes the signal Sct to fall from level "H" to level "L". When the signal Sct falls from level "H" to level "L", the comparator 115 transmits as the signal Sclk_ctl1 the signal Snxt_clk1 of level "L" generated in step S14 in FIG. 4A to the ICG 120-1, and transmits as the signal Sbp_enb1 the signal Snxt_bp1 of level "H" generated in step S14 in FIG. 4A to the selection circuit 150-1 (step S17 in FIG. 4A). The ICG 120-1 stops supplying the signal CLK to the scan chain circuits 140 (step S20 in FIG. 4B). The selection circuit 150-1 selects an input signal to the scan chain circuit 140-1 (step S23 in FIG. 4B).

At time t9 in FIG. 5, the tester raises the signal Ssft_enb from level "L" to level "H". During the period from time t10 to time t11 in FIG. 5, the semiconductor device 100 performs the shift operation based on the second test pattern (step S24 in FIG. 4B). During the period from time t10 to time t11, the tester transmits the second test pattern in the form of the signal SI1 to the circuit block 130-1. The semiconductor device 100 performs the shift operation, thereby setting the second test pattern to the scan cell 190-1.

Figure 6B:
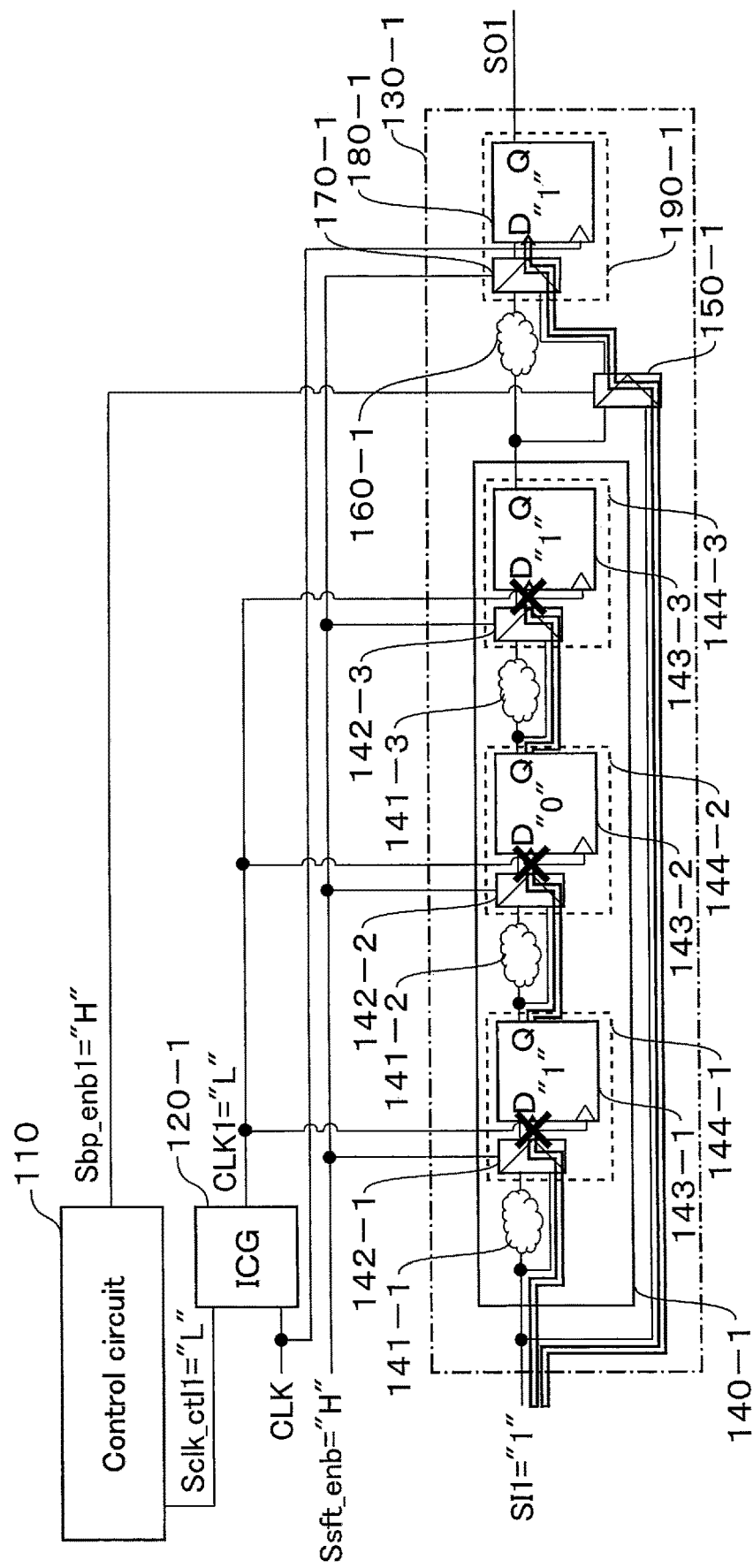
FIG. 6B is a block diagram of the semiconductor device according to the embodiment.

FIG. 6B shows how the semiconductor device 100 operates and signals are transferred when the tester transmits the second test pattern to the circuit block 130-1. FIG. 6B illustrates the state of the circuit block 130-1 at "1", which is smaller in terms of number of bits than the first test pattern, is transmitted as the second test pattern to the circuit block 130-1. As shown in FIG. 6B, the shift operation is performed one time when the signal Ssft_enb is at level "H", the signal Sclk_ctl1 is at level "L", and the signal Sbp_enb1 is at level "H". Accordingly, "1" is set to the scan cell 190-1. Since supply of the signal CLK to the scan cells 144-1 to 144-3 is stopped (the signal CLK1=level "L"), values in the scan cells 144-1 to 144-3 are not updated.

At time t12 in FIG. 5, the rising detection circuit 112 causes the signal Scu to fall form level "H" to level "L". The up counter 113 increases the counter value Vcnt by 1 when the signal Scu falls from level "H" to level "L" (step S25 in FIG. 4B).

At time t11 in FIG. 5, the tester causes the signal Ssft_enb to fall from level "H" to level "L". During the period from time t12 to time t13, the semiconductor device 100 performs the capture operation (step S26 in FIG. 4B). During the period from time t12 to time t13, the semiconductor device 100 drives the combinational circuits 141-1 to 141-3 and 160-1, thereby causing the scan cell 190-1 to retrieve an output signal from the combinational circuit 160-1. Since supply of the signal CLK to the scan cells 144-1 to 144-3 is stopped, output signals from the combinational circuits 141-1 to 141-3 are not retrieved in the scan cells 144-1 to 144-3. Thereafter, the operation performed is similar to that performed during the period from time t9 to time t13.

At time t12 in FIG. 5, the comparator 115 compares the counter value Vcnt with each of the first reference value FRV1 and the second reference value FRV2. At time t12, the counter value Vcnt (Vcnt=101) is equal to or greater than the first reference value, and the counter value Vcnt is not equal to the second reference value. Thus, the comparator 115 generates the signal Snxt_clk1 of level "L" and the signal Snxt_bp1 of level "H".

At time t14 in FIG. 5, the rising detection circuit 112 causes the signal Scu to fall from level "H" to level "L". When the signal Scu falls from level "H" to level "L", the up counter 113 increases the counter value Vcnt by 1 (step S25 in FIG. 4B).

At time t14 in FIG. 5, the comparator 115 compares the counter value Vcnt with each of the first reference value FRV1 and the second reference value FRV2. At time t14, the counter value Vcnt (Vcnt=500) is equal to or greater than the first reference value (step S11 in FIG. 4A, Yes), and the counter value Vcnt is equal to the second reference value (step S12 in FIG. 4A, Yes). Thus, the comparator 115 generates the signal Snxt_clk1 of level "H" and the signal Snxt_bp1 of level "H" (step S15 in FIG. 4A).

At time t16 in FIG. 5, the falling detection circuit 111 causes the signal Sct to fall from level "H" to level "L". When the signal Sct falls from level "H" to level "L", the comparator 115 transmits as the signal Sclk_ctl1 the signal Snxt_clk1 of level "H" generated in step S15 in FIG. 4A to the ICG 120-1, and transmits as the signal Sbp_enb1 the signal Snxt_bp1 of level "H" generated in step S15 in FIG. 4A to the selection circuit 150-1 (step S17 in FIG. 4A). The ICG 120-1 supplies (resupplies) the signal CLK to the scan chain circuits 140 (step S19 in FIG. 4B). The selection circuit 150-1 selects an input signal to the scan chain circuit 140-1 (step S23 in FIG. 4B).

At time t15 in FIG. 5, the tester raises the signal Ssft_enb from level "L" to level "H". During the period from time t16 to time t17, the semiconductor device 100 performs the shift operation based on the second test pattern (step S24 in FIG. 4B). During the period from time t16 to time t17, the tester transmits the second test pattern in the form of the signal SI1 to the circuit block 130-1. The semiconductor device 100 performs the shift operation, thereby setting the second test pattern to the scan cell 190-1.

Figure 6C:
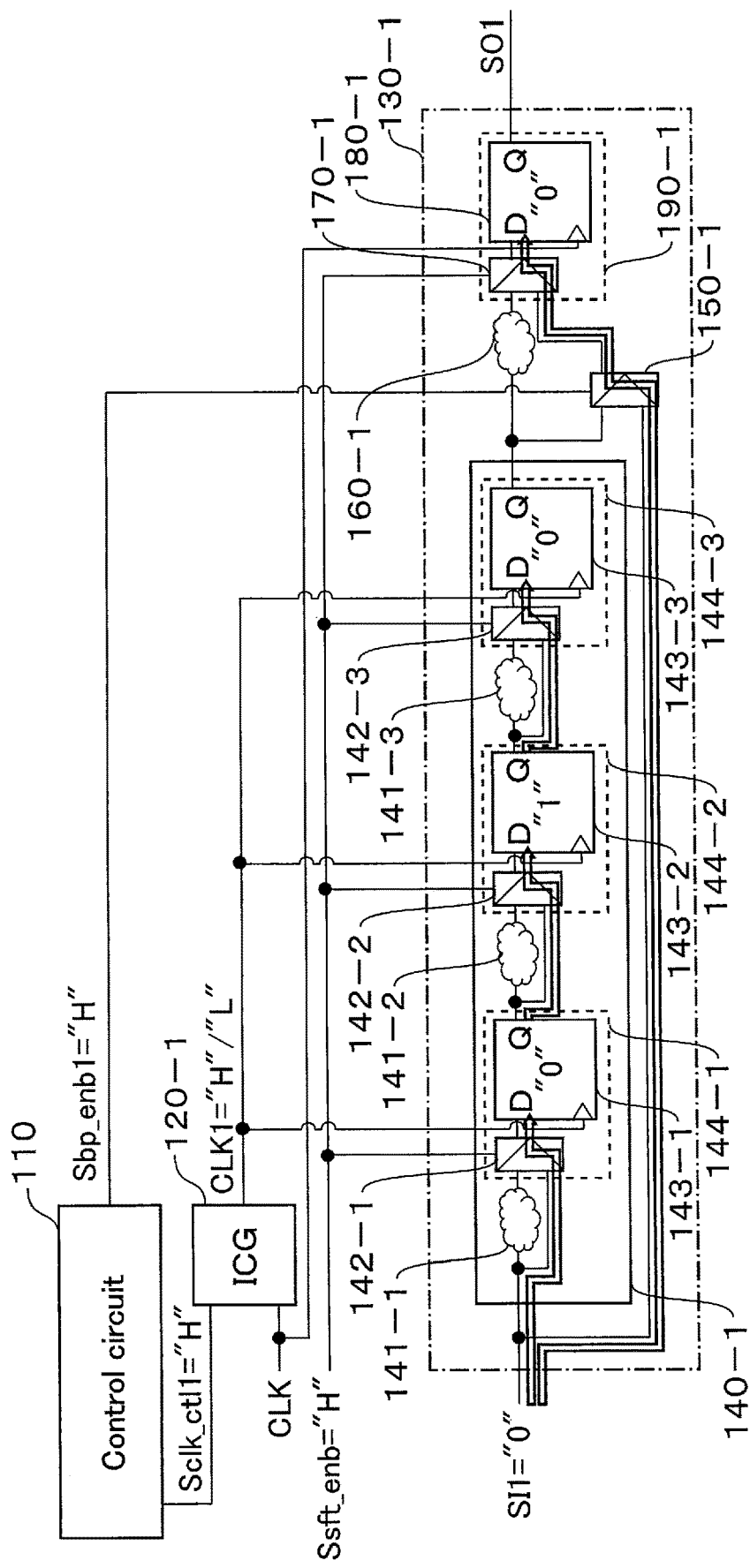
FIG. 6C is a block diagram of the semiconductor device according to the embodiment.

FIG. 6C shows how the semiconductor device 100 operates and signals are transferred when the tester transmits the second test pattern to the circuit block 130-1. FIG. 6C illustrates the state of the circuit block 130-1 when the second test pattern "0" is transmitted to the circuit block 130-1. As shown in FIG. 6C, the shift operation is performed one time when the signal Ssft_enb is at level "H", the signal Sclk_ctl1 is at level "H", and the signal Sbp_enb1 is at level "H". Accordingly, "0" is set to the scan cell 190-1. Since the signal CLK is resupplied to the scan cells 144-1 to 144-3, "0" is set to the scan cell 144-3, "1" is set to the scan cell 144-2, and "0" is set to the scan cell 144-1. In the case of the (M+1)th test, for example, a result of the Mth test (a value held in the scan cell 190-1) is output as the signal SO1. If the second test pattern is transmitted for the Mth test and (M+1)th test, the second test pattern for the (M+1)th test may be the same as or different from that for the Mth test.

At time t18 in FIG. 5, the rising detection circuit 112 causes the signal Scu to fall from level "H" to level "L". When the signal Scu falls from level "H" to level "L", the up counter 113 increases the counter value Vcnt by 1 (step S25 in FIG. 4B).

At time t17 in FIG. 5, the tester causes the signal Ssft_enb to fall from level "H" to level "L". During the period from time t18 to time t19, the semiconductor device 100 performs the capture operation (step S26 in FIG. 4B). During the period from time t18 to time t19, the semiconductor device 100 drives the combinational circuits 141-1 to 141-3 and 160-1, thereby causing the scan cells 144-1 to 144-3 and 190-1 to retrieve output signals from the combinational circuits 141-1 to 141-3 and 160-1.

At time t18 in FIG. 5, the comparator 115 compares the counter value Vcnt with each of the first reference value FRV1 and the second reference value FRV2. At time t18, the counter value Vcnt (Vcnt=501) is equal to or greater than the first reference value (step S11 in FIG. 4A, Yes), and the counter value Vcnt is not equal to the second reference value (step S12 in FIG. 4A, No). Thus, the comparator 115 generates the signal Snxt_clk1 of level "L" and the signal Snxt_bp1 of level "H".

At time t20 in FIG. 5, the falling detection circuit 111 causes the signal Sct to fall from level "H" to level "L". When the signal Sct falls from level "H" to level "L", the comparator 115 transmits as the signal Sclk_ctl1 the signal Snxt_clk1 of level "L" generated in step S14 in FIG. 4A to the ICG 120-1, and transmits as the signal Sbp_enb1 the signal Snxt_bp1 of level "H" generated in step S14 in FIG. 4A to the selection circuit 150-1 (step S17 in FIG. 4A). The ICG 120-1 stops supplying (resupplying) the signal CLK to the scan chain circuit 140. The selection circuit 150-1 selects an input signal to the scan chain circuit 140-1.

At time t19 in FIG. 5, the tester raises the signal Ssft_enb from level "L" to level "H". During the period from time t20 to time t21, the semiconductor device 100 performs the shift operation based on the second test pattern (step S24 in FIG. 4B). During the period from time t20 to time t21, the tester transmits the second test pattern in the form of the signal SI1 to the circuit block 130-1. The semiconductor device 100 performs the shift operation, thereby setting the second test pattern to the scan cell 190-1. Since supply of the signal CLK to the scan cells 144-1 to 144-3 is stopped, values in the scan cells 144-1 to 144-3 are not updated.

At time t22 in FIG. 5, the rising detection circuit 112 causes the signal Scu to fall from level "H" to level "L". When the signal Scu falls from level "H" to level "L", the up counter 113 increases the counter value Vcnt by 1 (step S25 in FIG. 4B).

At time t21 in FIG. 5, the tester causes the signal Ssft_enb to fall from level "H" to level "L". During the period from time t22 to time t23, the semiconductor device 100 performs the capture operation to drive the combinational circuits 141-1 to 141-3 and 160-1, thereby causing the scan cell 190-1 to retrieve an output signal from the combinational circuit 160-1. Since supply of the signal CLK to the scan cells 144-1 to 144-3 is stopped, output signals from the combinational circuits 141-1 to 141-3 are not retrieved in the scan cells 144-1 to 144-3. Thereafter, an operation is performed similar to that performed during the period from time t19 to time t23.

1.3 Advantageous Effect According to Present Embodiment

Figure 7:
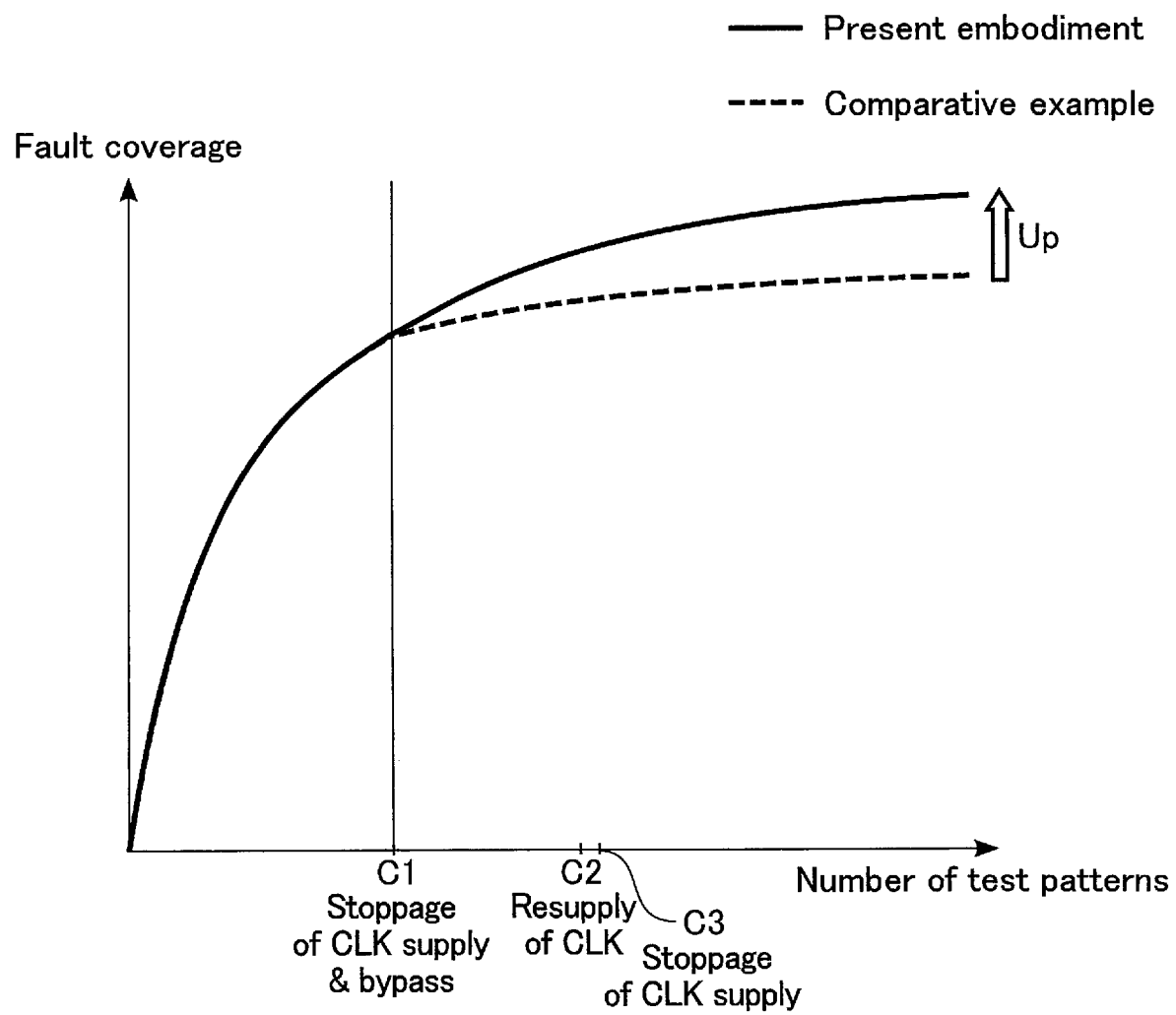
FIG. 7 is a view showing a relationship between the number of test patterns and a fault coverage of a combinational circuit when a scan test is performed on the semiconductor device according to the embodiment.

The configuration according to the present embodiment can improve the fault coverage of the semiconductor device. This advantageous effect will be described below. FIG. 7 is a view showing a relationship between the number of test patterns and a fault coverage of a combinational circuit when a scan test is performed on the semiconductor device according to the present embodiment.

In some cases of a scan test performed on a semiconductor device including scan chain circuits, supply of a clock signal is stopped with respect to a scan cell of a scan chain circuit in which fault detection has been completed, and no clock signal is resupplied to this scan chain circuit. FIG. 7 illustrates the above case as a comparative example. In particular, the broken line in FIG. 7 shows a relationship between the number of test patterns and the fault coverage in a scan test in the above case. In a semiconductor device in the above case, output from a scan cell becomes a fixed value after supply of a clock signal is stopped. Accordingly, in some cases, other combinational circuits which use the output from the scan, call may not be increased in terms of the fault coverage.

The semiconductor device 100 according to the present embodiment includes a plurality of scan chain circuits 140 each including a plurality of scan cells 144. During the period of a scan test, the semiconductor device 100 is operable for the purpose of ceasing the CLK signal supply to the scan cells 144 within the scan chain circuit 140 whose fault detection is completed, and, after bypassing the scan chain circuit 140 whose fault detection is completed, resupplying the signal CLK to the scan cells 144 of the scan chain circuit 140 whose fault detection is completed. Through the resupply of the signal CLK, values in the scan cells 144 are updated so that the fault coverage can be improved in other combinational circuits which use output from scan cells 144. This state is indicated by the solid line in FIG. 7.

As shown in FIG. 7, when the number of test patterns is C1, for example, the semiconductor device 100 stops supplying the signal CLK to the scan chain circuit 140, and bypasses the scan chain circuit 140. When the number of test patterns is C2, for example, the semiconductor device 100 resupplies the signal CLK to the scan chain circuit 140. Furthermore, when the number of test patterns is C3, for example, the semiconductor device 100 stops supplying the signal CLK to the scan chain circuit 140. As compared to the comparative example, the fault coverage improves after the same number of test patterns C1.

2. Modifications, Etc.

As described above, the semiconductor device according to the present embodiment includes the control circuit (110) configured to generate a first signal (Sclk_ctl1) and a second signal (Sbp_enb1), the gating circuit (120-1) configured to execute supply or stoppage of supply of a clock signal based on the first signal, and the circuit block (130-1) configured to accept the clock signal, the second signal, and a test pattern. The circuit block includes the scan chain circuit (140-1) configured to retrieve the test pattern based on the clock signal, and the selection circuit (150-1) configured to select, based on the second signal, a third signal output from the scan chain circuit or a fourth signal to be input to the scan chain circuit. The gating circuit is configured to execute resupply of the clock signal after the stoppage of the supply, based on the first signal during a period of a scan test.

By applying the above embodiment, the semiconductor device with improved fault coverage can be provided.

The embodiments are not limited to the configurations explained above and can be modified in various ways.

2.1. First Modification

The control circuit 110 is not limited to the circuit in the above embodiment, provided that it is configured to generate and transmit the signals Sclk_ctl1 and Sclk_ctl2 and the signals Sbp_enb1 and Sbp_enb2. The control circuit 110 in FIG. 3 is configured to hold the comparison values CV1 and CV2 as fixed values. However, the control circuit 110 may be configured in such a manner that the comparison values CV1 and CV2 are externally settable during a scan test on the semiconductor device 100. In this case, the control circuit 110 may be configured as shown in FIG. 8. Hereinafter, the circuit shown in FIG. 8 will be described in terms of only the differences from the control circuit 110 in FIG. 3.

The control circuit 110 in FIG. 8 is the same as the control circuit 110 in FIG. 3 except that the ROM 114 is replaced with a register 116.

For example, before the first scan test is started, a tester sets values shown in FIG. 9 to the register 116. FIG. 9 is a schematic view showing an example of a table held in the register 116. Regarding values to be set as the first reference value FRV1 and the second reference value FRV2 of the comparison value CV1, and as the first reference value SRV1 and the second reference value SRV2 of the comparison value CV2, the table respectively holds these values for addresses ADDs. For example, the table holds the first reference value FRV1 of the comparison value CV1 for address ADD1, the second reference value FRV2 of the comparison value CV1 for address ADD2, the first reference value SRV1 of the comparison value CV2 for address ADD3, and the second reference value SRV2 of the comparison value CV2 for address ADD4.

During the scan test period, the tester transmits, to the register 116, the addresses ADD1 to ADD4 in accordance with the number of test patterns. Upon receipt of the addresses ADD1 to ADD4, the register 116 transmits, to the comparator 115, the first reference value FRV1 of the comparison value CV1 corresponding to the address ADD1, the second reference value FRV2 of the comparison value CV1 corresponding to the address ADD2, the first reference value SRV1 of the comparison value CV2 corresponding to the address ADD3, and the second reference value SRV2 of the comparison value CV2 corresponding to the address ADD4. The other parts of the operation are the same as those shown in FIG. 3.

2.2 Second Modification

The control circuits 110 in FIGS. 3 and 8 are each configured to transmit the signals Sclk_ctl1 and Sclk_ctl2 and the signals Sbp_enb1 and Sbp_enb2 by hardware control; however, they may be configured to transmit the signals Sclk_ctl1 and Sclk_ctl2 and the signals Sbp_enb1 and Sbp_enb2 by software control. In this case, the control circuit 110 may be configured as shown in FIG. 10. Hereinafter, the circuit shown in FIG. 10 will be described.

The control circuit 110 shown in FIG. 10 includes D-FFs 117-1 to 117-4. The D-FFs 117-1 to 117-4 receive a command CMD in accordance with the number of test patterns input by a tester during a scan test period. When the signal CLK transmitted from the tester rises from level "L" to level "H", the D-FFs 117-1 to 117-4 retrieve values. The D-FFs 117-4 and 117-3 respectively transmit held values, as the signals Sclk_ctl1 and Sclk_ctl2, to, for example, the ICGs 120-1 and 120-2 shown in FIG. 1. The D-FFs 117-2 and 117-1 respectively transmit held values, as the signals Sbp_enb1 and Sbp_enb2, to, for example, the selection circuit 150-1 and 150-2 shown in FIG. 1. Furthermore, the D-FFs 117-1 to 117-4 reset held values in accordance with the signal RST transmitted from the tester. The command CMD includes a logic level indicating whether to supply the signal CLK to the scan chain circuits 140-1 and 140-2, and a logic level indicating whether to bypass the scan chain circuits 140-1 and 140-2.

For example, in the case of the number of test patterns ranging from 1 to 100, the control circuit 110 controls the ICG 120-1, thereby supplying the signal CLK to the scan chain circuit 140-1. The control circuit 110 does not select a route that bypasses the scan chain circuit 140-1 in the selection circuit 150-1. In this case, the control circuit 110 sets the signal Sclk_ctl to level "H" based on the command CMD of level "H" transmitted from the tester, and sets the signal Sbp_enb to level "L" based on the command CMD of level "L" transmitted from the tester.

In the case of the number of test patterns ranging from 101 to 500, the control circuit 110 controls the ICG 120-1, thereby stopping supply of the signal CLK to the scan chain circuit 140-1. The control circuit 110 then selects a route that bypasses the scan chain circuit 140-1 in the selection circuit 150-1. In this case, the control circuit 110 sets the signal Sclk_ctl to level "L" based on the command CMD of level "L" transmitted from the tester, and sets the signal Sbp_enb to level "H" based on the command CMD of level "H" transmitted from the tester.

In the case that the number of test patterns is 501, the control circuit 110 controls the ICG 120-1, thereby resupplying the signal CLK to the scan chain circuit 140-1. The control circuit 110 then selects the route that bypasses the scan chain circuit 140-1 in the selection circuit 150-1. In this case, the control circuit 110 sets the signal Sclk_ctl to level "H" based on the command CMD of level "H" transmitted from the tester, and sets the signal Sbp_enb to level "H" based on the command CMD of level "H" transmitted from the tester.

In the case of the number of test patterns ranging from 502 to the last, the control circuit 110 controls the ICG 120-1, thereby stopping supply of the signal CLK to the scan chain circuit 140-1. The control circuit 110 selects the route that bypasses the scan chain circuit 140-1 in the selection circuit 150-1. In this case, the control circuit 110 sets the signal Sclk_ctl to level "L" based on the command CMD of level "L" transmitted from the tester, and sets the signal Sbp_enb to level "H" based on the command CMD of level "H" transmitted from the tester.

For example, if the control circuit 110 receives command CMD="0110" from the tester, bits for the command CMD are shifted in such a manner that "0" is set to the D-FF 117-4, "1" is set to the D-FF 117-3, "1" is set to the D-FF 117-2, and "0" is set to the D-FF 117-1. Accordingly, the value in the D-FF 117-4 is output as the signal Sclk_ctl1, the value in the D-FF 117-3 is output as the signal Sclk_ctl2, the value in the D-FF 117-2 is output as the signal Sbp_enb1, and the value in the D-FF 117-1 is output as the signal Sbp_enb2.

2.3 Other Modifications

The scan chain circuits 140 is not limited to those of the circuit in the above embodiment, provided that they are each configured to include the scan cells 144. The circuit blocks 130 are not limited to those of the circuit in the above embodiment, provided that they are each configured to include the scan chain circuit and the selection circuit.

Figure 11:
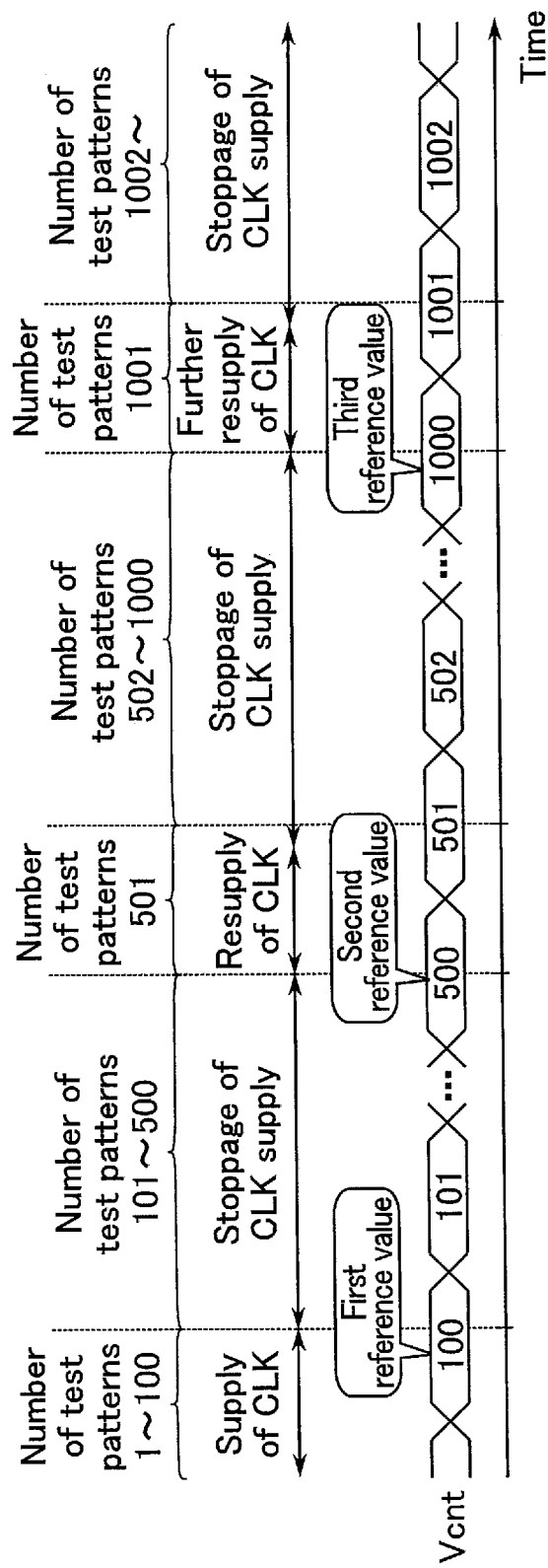
FIG. 11 is a timing chart for when signal CLK supply is started and stopped during a period of a scan test on a semiconductor device according to another modification of the embodiment.

The above embodiment was described based on the exemplary case in which after stopping supply of the signal CLK, the semiconductor device 100 resupplies the signal CLK; however, the semiconductor device 100 may be configured to stop supplying the signal CLK, resupply the signal CLK, stop resupplying the signal CLK, and then resupply the signal CLK again. In such a case, the first reference value, the second reference value, and a third reference value (the first reference value<the second reference value<the third reference value) are prepared for each of the comparison values CV1 and CV2. For example, the first to third reference values may be set in such a manner that supply of the signal CLK is stopped when the number of test patterns reaches the first reference value, restarted (resupplied) when the number of test patterns reaches the second reference value, and restarted (resupplied) again when the number of test patterns reaches the third reference value. Furthermore, (the second reference value+1) and (the third reference value+1) may be set in such a manner that resupply of the signal CLK is stopped when the number of test patterns reaches (the second reference value+1), and another resupply of the signal CLK is stopped when the number of test patterns reaches (the third reference value+1). Operation of a scan test in such a case will be described with reference to FIG. 11. FIG. 11 is a timing chart for when supply of the signal CLK is performed and stopped during a scan test period. Herein, the first reference value is set to 100, the second reference value is set to 500, and the third reference value is set to 1000.

As shown in FIG. 11, during the period corresponding to the number of test patterns ranging from 1 to 100, the semiconductor device 100 supplies the signal CLK to the scan chain circuit 140. During the period corresponding to the number of test patterns ranging from 101 to 500, the semiconductor device 100 stops supplying the signal CLK to the scan chain circuit 140. During the period corresponding to the number of test patterns being 501, the semiconductor device 100 resupplies the signal CLK to the scan chain circuit 140. During the period corresponding to the number of test patterns ranging from 502 to 1000, the semiconductor device 100 again stops supplying the signal CLK to the scan chain circuit 140.

In the case that the number of test patterns is equal to the third reference value (the counter value Vcnt=1000), the comparator 115 generates the signal Snxt_clk of level "H". When the signal Sct falls from level "H" to level "L", the comparator 115 transmits, as the signal Sclk_ctl, the generated signal Snxt_clk of level "H" to the ICG 120-1. Based on the signal Sclk_ctl, the ICG 120-1 resupplies the signal CLK again to the scan chain circuit 140-1. That is, during the period corresponding to the number of test patterns being 1001, the semiconductor device 100 again resupplies the signal CLK to the scan chain circuit 140-1.

If the number of test patterns is greater than the third reference value (the counter value Vcnt>1000), the comparator 115 generates the signal Snxt_clk of level "L". When the counter value Vcnt increases, the comparator 115 transmits, as the signal Sclk_ctl, the generated signal Snxt_clk of level "L" to the ICG 120-1. Based on the signal Sclk_ctl, the ICG 120-1 again stops supplying the signal CLK to the scan chain circuit 140-1. That is, during the period corresponding to the number of test patterns ranging from 1002 to the last, the semiconductor device 100 again stops supplying the signal CLK to the scan chain circuits 140.

In the above embodiment, level "L"/"H" of the signal Ssft_enb, the signal Sct, the signal Scu, the signal Sclk_ctl, and the signal Sbp_enb may be reversed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a gating circuit configured to execute supply or stoppage of supply of a clock signal;
a circuit block configured to accept the clock signal and a test pattern and
a control circuit configured to generate a first signal for controlling the gating circuit and a second signal for controlling the circuit block,
wherein the circuit block comprises:
a scan chain circuit configured to retrieve the test pattern based on the clock signal, and output a test result with respect to the test pattern; and
a selection circuit configured to select the test result or the test pattern based on the second signal,
wherein the gating circuit is configured to execute resupply of the clock signal after the stoppage of the supply, based on the first signal during a period of a scan test.

2. The device according to claim 1, wherein the control circuit generates the first signal based on a number of test patterns that is input during the period.

3. The device according to claim 2, wherein when the number of test patterns input during the period is lower than a first reference value, the gating circuit supplies the clock signal based on the first signal,
when the number of test patterns input during the period is equal to or greater than the first reference value, the gating circuit stops supplying the clock signal based on the first signal,
when the number of test patterns input during the period is equal to a second reference value different from the first reference value, the gating circuit resupplies the clock signal based on the first signal, and
when the number of test patterns input during the period is greater than the second reference value, the gating circuit stops supplying the clock signal based on the first signal.

4. The device according to claim 3, wherein the second reference value is greater than the first reference value.

5. The device according to claim 3, wherein the control circuit comprises:
a counter configured to count the number of test patterns input during the period; and
a comparator configured to compare a counter value in the counter with the first reference value, and the counter value with the second reference value,
wherein the first signal is generated based on a comparison result obtained by the comparator.

6. The device according to claim 5, wherein the control circuit generates the second signal based on the number of test patterns input during the period,
wherein when the number of test patterns input during the period is lower than the first reference value, the selection circuit selects the test result based on the second signal, and
when the number of test patterns input during the period is equal to or greater than the first reference value, the selection circuit selects the test pattern based on the second signal.

7. The device according to claim 6, wherein the second signal is generated based on a comparison result obtained by the comparator.

8. The device according to claim 3, wherein the first reference value and the second reference value are respectively fixed values.

9. The device according to claim 3, wherein the first reference value and the second reference value are externally settable.

10. The device according to claim 3, wherein when the number of test patterns input during the period is equal to a third reference value different from the first reference value and the second reference value, the gating circuit resupplies the clock signal again based on the first signal, and
when the number of test patterns input during the period is greater than the third reference value, the gating circuit stops supplying the clock signal based on the first signal.

11. The device according to claim 10, wherein the third reference value is greater than the second reference value.

12. The device according to claim 3, wherein the control circuit generates the second signal based on the number of test patterns input during the period,
wherein when the number of test patterns input during the period is lower than the first reference value, the selection circuit selects the test result based on the second signal, and
when the number of test patterns input during the period is equal to or greater than the first reference value, the selection circuit selects the test pattern based on the second signal.

13. The device according to claim 2, wherein the control circuit generates the second signal based on the number of test patterns input during the period,
wherein when the number of test patterns input during the period is lower than the first reference value, the selection circuit selects the test result based on the second signal, and
when the number of test patterns input during the period is equal to or greater than the first reference value, the selection circuit selects the test pattern based on the second signal.

14. The device according to claim 1, wherein the control circuit is configured to:
when the clock signal is supplied to the scan chain circuit in accordance with the number of test patterns input during the period, set the first signal to a first logic level; and
when supply of the clock signal to the scan chain circuit is stopped, set the first signal to a second logic level different from the first logic level.

15. The device according to claim 1, wherein the control circuit generates the second signal based on the number of test patterns input during the period.

16. The device according to claim 15, wherein when the number of test patterns input during the period is lower than the first reference value, the selection circuit selects the test result based on the second signal, and
when the number of test patterns that is input during the period is equal to or greater than the first reference value, the selection circuit selects the test pattern based on the second signal.

17. The device according to claim 16, wherein the control circuit comprises:
- a counter configured to count the number of test patterns that is input during the period; and
- a comparator configured to compare a counter value in the counter with the first reference value,
- wherein the second signal is generated based on a comparison result obtained by the comparator.

18. The device according to claim 1, wherein the control circuit is configured to:
- when the scan chain circuit is not bypassed in accordance with the number of test patterns input during the period, set the second signal to a first logic level; and
- when the scan chain circuit is bypassed, set the second signal to a second logic level different from the first logic level.

* * * * *